United States Patent
Schmid

(10) Patent No.: US 12,417,709 B2
(45) Date of Patent: Sep. 16, 2025

(54) SIGNAL GENERATION SYSTEMS AND METHODS FOR USING SAME

(71) Applicant: Dedrone Holdings, Inc., Sterling, VA (US)

(72) Inventor: Zachary Schmid, San Francisco, CA (US)

(73) Assignee: Dedrone Holdings, Inc., San Francisco, CA (US)

(*) Notice: Subject to any disclaimer, the term of this patent is extended or adjusted under 35 U.S.C. 154(b) by 39 days.

(21) Appl. No.: 18/441,120

(22) Filed: Feb. 14, 2024

(65) Prior Publication Data

US 2025/0182634 A1 Jun. 5, 2025

Related U.S. Application Data

(60) Provisional application No. 63/496,433, filed on Apr. 17, 2023.

(51) Int. Cl.
*G08G 5/00* (2025.01)
*G06F 1/08* (2006.01)
(Continued)

(52) U.S. Cl.
CPC ............. *G08G 5/59* (2025.01); *G06F 1/08* (2013.01); *H03L 7/083* (2013.01); *G06F 1/12* (2013.01); *G08C 17/02* (2013.01); *G08G 5/57* (2025.01)

(58) Field of Classification Search
CPC .......... G08G 5/59; G08G 5/57; G08G 5/0069; G08C 17/02; G06F 1/08; G06F 1/12;
(Continued)

(56) References Cited

U.S. PATENT DOCUMENTS 3,341,812 A * 9/1967 Perkinson ............... G01S 11/08
342/31
4,841,524 A * 6/1989 Miyaou ................... H04J 3/073
370/535

(Continued)

FOREIGN PATENT DOCUMENTS

CN 101247162 B * 4/2012

*Primary Examiner* — Adnan Aziz
(74) *Attorney, Agent, or Firm* — Bradley Arant Boult Cummings LLP; Adam J. Thompson., Esq.; Daniel E. Sineway, Esq.

(57) ABSTRACT

An electronics device can include a clock circuit, a first oscillator, signal expansion circuits, and an antenna. The clock circuit can generate a reference clock. The first oscillator can generate an initial waveform at an output based on the reference clock. The signal expansion circuits can be coupled in series and can receive the initial waveform at a front signal expansion circuit and output a resultant signal at an end signal expansion circuit of the plurality of signal expansion circuits. The signal expansion circuits can receive an input frequency on the respective frequency input and generate a respective additional frequency based on the reference clock. The signal expansion circuits can generate a merged frequency by merging the input frequency and the respective additional frequency and output the merged frequency from the respective frequency output. The antenna can transmit the transmission signal based on the resultant signal.

20 Claims, 10 Drawing Sheets

(51) Int. Cl.
  *G06F 1/12*    (2006.01)
  *G08C 17/02*   (2006.01)
  *G08G 5/59*    (2025.01)
  *H03L 7/083*   (2006.01)
  *G08G 5/57*    (2025.01)

(58) Field of Classification Search
  CPC .. H03L 7/16; H03L 7/06; H03L 7/083; H03B 27/00; H04B 1/71632; H04B 1/02
  USPC ............... 340/13.25; 342/31; 455/146, 196.1
  See application file for complete search history.

(56)          References Cited

U.S. PATENT DOCUMENTS

2006/0087352 A1*  4/2006  Byun ................... G01R 23/005
                                                     327/156
2006/0132190 A1*  6/2006  Driediger ............... G01R 23/10
                                                     327/47
2014/0266471 A1*  9/2014  Zhu .......................... H03L 7/18
                                                     331/34
2017/0359076 A1* 12/2017  Rafi ...................... H03L 7/0891
2020/0103931 A1*  4/2020  Lin ........................... G06F 1/08
2022/0086741 A1*  3/2022  Liao ......................... G08G 5/26
2024/0137066 A1*  4/2024  Krauska ............. H04B 1/71632

\* cited by examiner

SIGNAL GENERATION SYSTEMS AND METHODS FOR USING SAME

CROSS-REFERENCE TO RELATED APPLICATIONS

This application claims the benefit of, and priority to, U.S. Provisional Patent Application No. 63/496,433, filed on Apr. 17, 2023, and entitled "NOISE GENERATION SYSTEMS AND METHODS FOR USING SAME," the disclosure of which is incorporated by reference in its entirety as if the same were fully set forth herein.

TECHNICAL FIELD

The present apparatuses, systems, and methods relate generally to signal generation, and more specifically to generating band and/or frequency-specific signals through various analog and/or digital signal processing techniques.

BACKGROUND

Drones and uncrewed aircraft systems have become ubiquitous devices used by civilian and government agencies. Operated as weapons, camera surveillance systems, and/or data gathering systems, drones can pose significant threats to restricted environments. Systems for identifying and mitigating drones in an unauthorized airspace are becoming significantly more necessary to protect restricted airspaces.

Therefore, there is a long-felt but unresolved need for a system or method that can prevent unauthorized unmanned aerial vehicles from entering restricted airspaces.

BRIEF SUMMARY OF DISCLOSURE

Briefly described, and in various embodiments, the present disclosure relates to systems and methods for generating interference signal for disabling communications between unmanned aerial vehicles (UAV) and their corresponding communication devices. The disclosed innovation can relate to an analog and/or digital system capable of generating interference signals that jam communications between the UAV and its corresponding communication device. Though discussed in the context of generating interference signals for UAV activities, the disclosed innovation can be used for generating signals for any particular purpose (e.g., RF component testing). The disclosed innovation can include a carrier oscillator, sideband generators, and an up/down converter.

The carrier oscillator can generate an initial waveform for processing by the one or more sideband generators. The carrier oscillator can generate the initial waveform with frequencies in the range of 0 to 6 GHz. The carrier oscillator can generate initial frequencies in any particular frequency range. The wide-band variable oscillator can input the initial waveform into a radio frequency input of the front sideband generator.

The sideband generators can be defined as frequency manipulation systems for increasing the bandwidth of the initial waveform generated and input by the carrier oscillator. For example, the sideband generators can exponentially grow the initial waveform based on the specifications for the interference signal. The sideband generators can be assembled in series and can receive the generated frequencies of the previous sideband generator. For example, the front sideband generator can output a first generated frequency and can input the first generated frequency into a second sideband generator. The first generated frequency can include a first signal that can be twice the bandwidth and/or frequency of the initial waveform. Continuing the previous example, the second sideband generator can generate a second generated frequency and can input the second generated frequency into a third sideband generator. The second generated frequency can include a second signal that can be twice the bandwidth and/or frequency of the first generated frequency. The process of doubling the input signal by the sideband generators can continue until a desired interference signal is achieved. The final sideband generator can generate a resultant frequency. The up/down converter can process the resultant frequency to generate an up-shifted or down-shifted variation of the resultant frequency. The up/down converter can output the interference signal for propagation through an antenna.

These and other aspects, features, and benefits of the claimed innovation(s) will become apparent from the following detailed written description of the preferred embodiments and aspects taken in conjunction with the following drawings, although variations and modifications thereto may be effected without departing from the spirit and scope of the novel concepts of the disclosure.

BRIEF DESCRIPTION OF THE FIGURES

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein.

DETAILED DESCRIPTION

Figure 1:
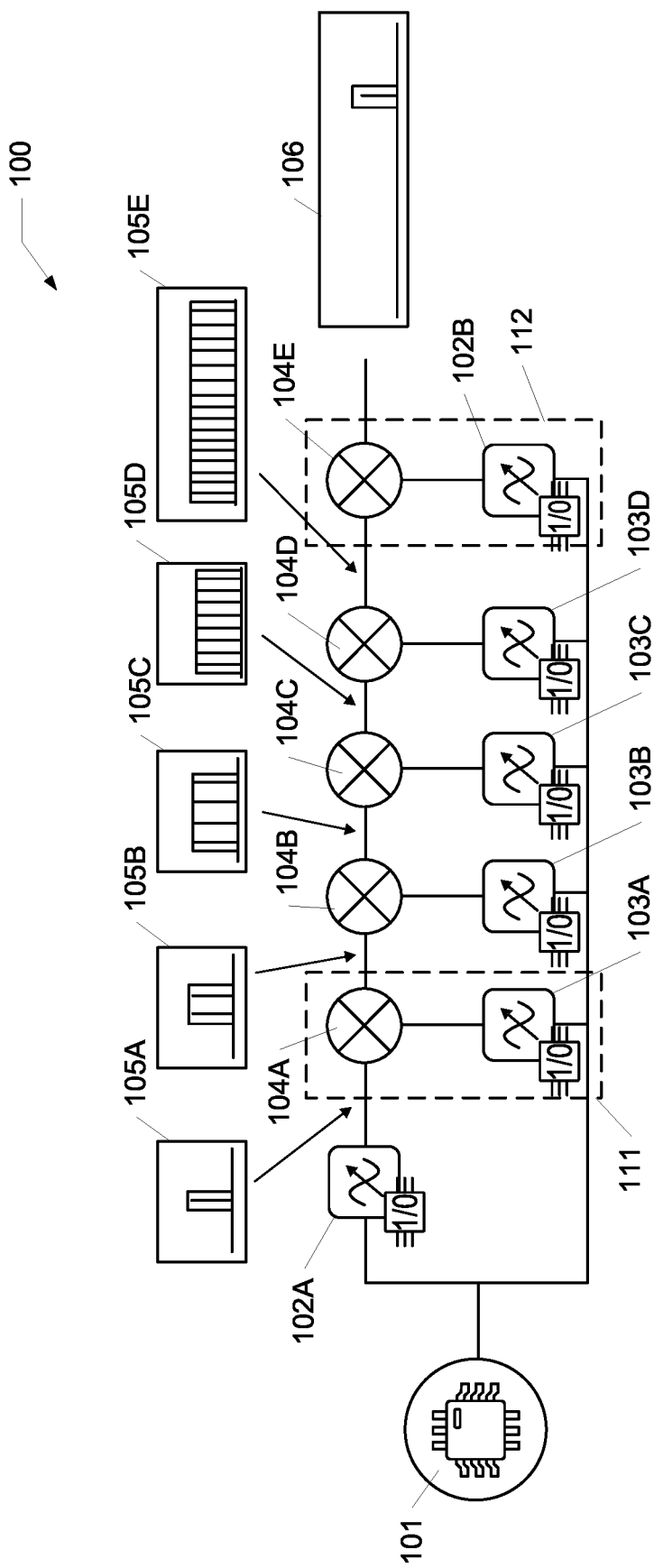
FIG. 1 illustrates an exemplary first signal generation system, according to one embodiment of the present disclosure.

Whether a term is capitalized is not considered definitive or limiting of the meaning of a term. As used in this document, a capitalized term shall have the same meaning as an uncapitalized term, unless the context of the usage specifically indicates that a more restrictive meaning for the capitalized term is intended. However, the capitalization or lack thereof within the remainder of this document is not intended to be necessarily limiting unless the context clearly indicates that such limitation is intended.

Overview

For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates. All limitations of scope should be determined in accordance with and as expressed in the claims.

Aspects of the present disclosure generally relate to systems and methods for generating interference signal for disabling communications between unmanned aerial vehicles (UAV) and their corresponding communication devices. The disclosed innovation can relate to an analog and/or digital system, referred to herein as a signal generation system, capable of generating signals that jam communications between the UAV and its corresponding communication device. Though discussed in the context of generating interference signals for UAV activities, the disclosed innovation can be used for generating signals for any particular purpose (e.g., RF component testing). The disclosed innovation can include a control unit, a signal generator, a carrier oscillator, sideband generators, and an up/down converter.

The control unit of the signal generation system can generated a reference clock. The reference clock can be employed by the carrier oscillators and local oscillators (LOs) of the signal generation system. For example, the carrier oscillators and the local oscillators can generate signals based on the reference clock. The control unit can include a micro-processing system, a system-on-a-chip, a microcontroller, a central computing unit, and/or any particular computing device capable of generating the reference clock. The control unit can generate the reference clock through a clock circuit. The control unit can control processes associated with the signal generation system. For example, the control unit can interface with and control one or more switches of the signal generation system. In another example, the control unit can perform processing, communication, diagnostics, UAV detection, and/or any particular computation or communication associated with the signal generation system.

The carrier oscillator can generate an initial waveform for processing by the one or more sideband generators. The carrier oscillator can vary the output frequency of the initial waveform by adjusting the voltage applied to the carrier oscillator. For example, the control unit can vary the voltage applied to the carrier oscillator to adjust the frequency of the initial waveform. The carrier oscillator can generate the initial waveform with frequencies in the range of 0 to 6 GHz. The carrier oscillator can generate initial frequencies in any particular frequency range. The carrier oscillator can include one or more paths for preprocessing the initial waveform prior to inputting the initial waveform into a radio frequency input of the front sideband generator. For example, the carrier oscillator can send the initial waveform through a low-pass filter, a high-pass filter, or a band-pass filter to remove harmonics associated with the initial waveform, remove artifacts, and remove noise. Each of the filters can include their own path and the control unit can determine the path for the initial waveform depending on the desired interference signal. The initial waveform passed through the filters or the unfiltered initial waveform can be mixed with a noise signal generated by the signal generator. The control unit can configure the switches to determine the type of initial waveform to process through the sideband generators.

The sideband generators can be defined as frequency manipulation systems for increasing the bandwidth of the initial waveform input by the carrier oscillator. For example, the sideband generators can exponentially grow the initial waveform based on the required interference signal. The sideband generators can be assembled in series and can receive the generated frequencies of the previous sideband generator. For example, the front sideband generator can output a first generated frequency and can input the first generated frequency into a second sideband generator. The first generated frequency can include a first signal that can be twice the bandwidth and/or frequency of the initial waveform. Continuing the previous example, the second sideband generator can generate a second generated frequency and can input the second generated frequency into a third sideband generator. The second generated frequency can include a second signal that can be twice the bandwidth and/or frequency of the first generated frequency. The process of doubling the input signal by the sideband generators can continue until a desired interference signal is achieved. The sideband generators can be configured to generate signals that either fully fill the desired frequency bands or partially fill the desired frequency bands. For example, the sideband generators can be configured to each generate narrow signals relative to the entire frequency band. By generating narrow signals relative to an entire frequency band, the sideband generators can focus on specific areas of the frequency band.

The sideband generators can include the local oscillators and mixing units. The local oscillator can include a reference clock input. The reference clock input can receive the reference clock of the control unit for generating a local oscillator frequency. The local oscillator can output the local oscillator frequency to the local oscillator input of the mixer. The mixer can receive either the initial waveform or the generated frequency from a previous sideband generator at a radio frequency input. For example, the mixer can combine the local oscillator frequency and the initial waveform to generate the first generated frequency. Continuing this example, the first generated frequency is the sum of the local oscillator frequency and the initial waveform. The first generation frequency is double the initial waveform when the local oscillator frequency and the initial waveform are equivalent.

The sideband generators can include an attenuator and an amplifier to process incoming signals. For example, the sideband generator can employ the attenuator to reduce the power and amplitude of an incoming signal. The sideband generator can reduce the power and amplitude of the incoming signal to maintain temperature thresholds of the signal generation system. The sideband generator can employ the amplifier to increase the power and amplitude of generated frequencies. The sideband generator can increase the power and amplitude of the generated frequencies to restore losses incurred by the mixing procedure.

The up/down converter can process a resultant frequency to generate an up-shifted or down-shifted variation of the resultant frequency. The up/down converter can include a second carrier oscillator to up scale or down scale the resultant frequency generated by the final sideband generator. The up/down converter can include various switches and paths that determine the type of filter applied to the resultant frequency. For example, the up/down converter can include three paths, where one of the paths includes a low-pass filter, one of the paths includes a high-pass filter, and one of the paths includes a band-pass filter. The up/down converter can use the filters to narrow the bandwidth of the resultant frequency to a desired range. Once processed, the up/down converter can output the interference signal for propagation through an antenna towards an unmanned aerial vehicle.

Example Embodiments

Referring now to the figures, for the purposes of example and explanation of the fundamental processes and components of the disclosed apparatuses, systems, and methods, reference is made to FIG. 1, which illustrates an exemplary, high-level overview of a first signal generation system 100, according to at least one embodiment of the present disclosure. As will be understood and appreciated, the exemplary, high-level overview of the first signal generation system 100 shown in FIG. 1 may represent merely one approach or embodiment of the present disclosure, and other aspects are used according to various embodiments of the present disclosure.

The first signal generation system 100 can function as a device for generating an interference signal 106 (also referred to as a transmission signal). The interference signal 106 may be used for jamming one or more communications between an unmanned aerial vehicle (UAV), its corresponding communication device (e.g., a remote control), and/or any other component of an uncrewed aircraft system (UAS). The UAS may be defined as all the components that allow the unmanned aerial vehicle to function properly (e.g., the UAV, the communication device). Common unmanned aerial vehicles can include but are not limited to multi-rotor drones, fixed-wing drones, single-rotor drones, and/or groups 1-5 UAVs. The unmanned aerial vehicle can be defined as any remotely controlled airborne vehicle that flies without an onboard pilot and at a particular distance from the communication device. During operation, a user can control the communication device to send wireless communications to the unmanned aerial vehicle. The first signal generation system 100 and/or supporting systems can monitor for unmanned aerial vehicles traveling in a restricted airspace or any particular airspace. Once the first signal generation system 100 and/or the supporting system identifies the unmanned aerial vehicle, the first signal generation system 100 can generate the interference signal 106 to target a specific band of communication between the communication device and the unmanned aerial vehicle. The first signal generation system 100 and/or the supporting systems can identify and target the specific bands of communication between the UAV ant the communication device. The first signal generation system 100 can generate the interference signal 106 with enough intensity such that the communication device and/or the UAV being targeted by the first signal generation system 100 cannot receive comprehensible wireless commands. For example, the UAV cannot interpret a "return to home" command sent by the communication device while the first signal generation system 100 generates the interference signal 106 for the particular band of communication used by the UAV.

Though discussed in the context of generating one or more interference signals 106, the first signal generation system 100 can generate signals for various different applications. For example, the first signal generation system 100 can generate signals for various RF testing applications.

The first signal generation system 100 can generate the interference signal 106 at various different frequencies and/or frequency bands. The first signal generation system 100 can jam specific communication channels between the UAV and its corresponding communication device. For example, the first signal generation system 100 can generate signal ranges or specific frequencies including but not limited to 243 MHz, 900-928 MHz, 2.4-2.5 GHZ, 5.725-5.825 GHz, 1.0-2.0 GHz (L-Band), 433 MHz, 915 MHz, 1.2 GHz, 1.5 GHZ, 2450 MHz, 5800 MHZ, industrial, scientific, and medical (ISM) radio bands, Unlicensed National Information Infrastructure (U-NII) 1-8 radio bands, Global navigation satellite system (GNSS) bands, and/or any particular frequency or frequency band used in a particular electronic application. The first signal generation system 100 can generate the interference signal 106 to target singular frequencies associated with specific communications. For example, the first signal generation system 100 can generate an interference signal 106 at the center frequency 915 MHz. The first signal generation system 100 can generate the interference signal 106 to target more than one frequency simultaneously across a frequency band associated with one or more communications. For example, the first signal generation system 100 can generate an interference signal 106 across the 900-928 MHz frequency band to target communications conducted within this particular frequency band.

The first signal generation system 100 can be developed as an analog system, as a digital system, or as a combination thereof. For example, the first signal generation system 100 can be developed from purely analog components to generate the desired interference signal 106. In another example, the first signal generation system 100 can be developed from a purely digital system to generate the desired interference signal 106. In another example, the first signal generation system 100 can be developed from a combination of digital components and analog components to generate the desired interference signal 106. The first signal generation system 100 can include direct electrical connections between each of the components. The first signal generation system 100 can include a modular system allowing for upgrading components, reconfiguring components, and changing components to maximize performance. The first signal generation system 100 can include remote capabilities such that one or more components of the first signal generation system 100 can function independently from the system.

The first signal generation system 100 can include a control unit 101, carrier oscillators 102A-B, local oscillators 103A-D, and mixers 104A-D. The first signal generation system 100 may include other components discussed in further detail herein. Traditional signal generation systems are fixed to a certain bandwidth or frequency value. Additionally, traditional signal generation systems include expensive parts that have long-lead times. The first signal generation system 100 can overcome the issues presented by the traditional signal generation systems by providing a variable frequency signal source from commonly available and relatively inexpensive components. The first signal generation system 100 can generate various frequencies by expanding an initial waveform 105A through one or more sideband generators 111 (also referred to as signal expansion circuits). The initial waveform 105A can include a single frequency signal, a frequency sweep signal, or any particular type of complex signal modulation. The sideband generators 111 can exponentially clone the initial waveform 105A until reaching the desired expanded frequency and/or frequency ranges. The process of exponentially cloning the initial waveform using sideband generators 111 can be more cost effective and less component intensive as compared to traditional signal generation systems.

The control unit 101 can include any particular microcontroller system used to configure the one or more carrier oscillators 102A-B, the local oscillators 103A-B, and/or any other system in the first signal generation system 100. The control unit 101 can be any particular microcontroller system or microprocessor for use in wireless communication systems. The control unit 101 can configure the frequency for each of the carrier oscillators 102A-B, the local oscillators 103A-D, and/or any particular component of the first signal generation system 100. For example, the control unit 101 can configure the carrier oscillators 102A-B and the local oscillators 103A-D to generate one or more signals with any particular frequency. Continuing this example, by configuring the carrier oscillators 102A-B and the local oscillators 103A-D to generate one or more signals with distinct frequency outputs, the first signal generation system 100 can generate one or more interference signals 106 with varying frequencies. The control unit 101 can configure the carrier oscillators 102A-B and the local oscillators 103A-D to generate substantially similar signals with substantially similar frequencies. The carrier oscillators 102A-B and the local oscillators 103A-D can be configured by the control unit 101 to vary their respective frequencies based on a reference clock. The reference clock can generate a fixed reference frequency such that the carrier oscillators 102A-B, the local oscillators 103A-D, and/or any other component in the first signal generation system 100 can use the fixed reference frequency as a reference for synchronizing operations (see FIG. 2 for further details).

The control unit 101 can control processes associated with the first signal generation system 100. For example, the control unit 101 can interface with and control one or more switches (see FIG. 2 for further details) of the first signal generation system 100. In another example, the control unit 101 can perform processing, communication, diagnostics, UAV detection, and/or any particular computation or communication associated with the first signal generation system 100.

The carrier oscillators 102A-B may be any particular variably controlled signal generating system. For example, the carrier oscillators 102A-B can include a fixed oscillator. In another example, the carrier oscillator 102A may include a voltage-controlled oscillator for generating the initial waveform 105A. Continuing this example, the carrier oscillator 102A can generate the initial waveform 105A with a variable frequency based on the input voltage of the system. The carrier oscillator 102A can generate the initial waveform 105A for processing by the one or more sideband generators 111. The carrier oscillator 102B may couple with the mixer 104E and other components (see FIG. 2) to upshift or downshift a resultant frequency 105E (or referred to as a resultant signal) generated by the one or more sideband generators 111. The carrier oscillators 102A-B may generate frequencies and/or frequency bands in a variety of ranges, such as, for example a range of at least 12.5 MHz, 12.5 MHz to 6.4 GHz, 12 MHz to 2.0 GHz, 2.0 GHz to 4.0 GHz, 4.0 GHz to 6.4 GHz, or less than 6.4 GHz. In some embodiments, the range of frequencies can correspond to frequencies used to control one or more types of drones. The carrier oscillators 102A-B may function at particularly low powers (e.g., 75 mA). The carrier oscillators 102A-B can support frequency-shift keying (FSK) modulation, discrete level FSK, and pulse-shaping FSK. The carrier oscillators 102A-B may include phase synchronization for the various components, devices, and/or systems integrated with the carrier oscillators 102A-B. The carrier oscillators 102A-B can include but are not limited to direct digital synthesizers (DDS), voltage-controlled oscillators (VCO), phase-locked loops (PLL), crystal oscillators, and/or any other particular synthesizer for generating frequencies. The carrier oscillators 102A-B can connect to the reference clock (see FIG. 2). The carrier oscillators 102A-B can receive commands from the control unit 101 to change their particular frequency outputs relative to the reference clock. The carrier oscillators 102A-B can vary their frequency outputs based on the commands generated by the control unit 101 and based on the reference clock.

The local oscillators 103A-D can function as local oscillators (LOs) for the mixers 104A-D, respectively. The local oscillators 103A-D can generate a signal with frequencies measuring greater than 0 Hz, 0 Hz to 125 MHz, 0 Hz to 20 MHz, 20 MHz to 40 MHz, 40 MHz to 60 MHz, 60 MHz to 80 MHz, 80 MHz to 100 MHz, 100 MHz to 125 MHz, or less than 125 MHz, though any particular frequency or frequency range can be produced by the local oscillators 103A-D. The local oscillators can generate signals in any particular range depending on the needs of the first signal generation system 100. The local oscillators 103A-D may be any particular system that generates signals. For example, the local oscillators 103A-D can include but are not limited to direct digital synthesizers (DDS), voltage-controlled oscillators (VCO), phase-locked loops (PLL), crystal oscillators, and/or any other particular synthesizer for generating signals with distinct frequencies. The local oscillators 103A-D can generate one or more LO frequencies for mixing through the mixers 104A-D. For example, the mixer 104A may mix a first LO frequency generated by the local oscillator 103A with the initial waveform 105A generated by the carrier oscillator 102A. The local oscillators 103A-D can connect to the reference clock to receive the fixed reference frequency. The control unit 101 can configure the local oscillators 103A-D to vary their respective frequency outputs based on the reference clock.

The mixers 104A-D can receive two input frequencies (also referred to as input signals) and generate an output frequency (also referred to as an output signal) based on the two input frequencies. The mixers 104A-D can mix two input frequencies together by receiving the input frequencies at a radio frequency input and a local oscillator input. For example, the mixer 104A can mix the initial waveform 105A generated by the carrier oscillator 102A and inputted through the radio frequency input with the first LO frequency generated by the local oscillator 103A and inputted through the local oscillator input. Continuing this example, the mixer 104A can generate a first generated frequency 105B. The first generated frequency 105B can include two resultant signals, where the first resultant signal can be a difference between the initial waveform 105A and the first LO frequency and the second resultant signal can be a sum between the initial waveform 105A and the first LO frequency. For example, the mixer 104A may generate a 410 MHz signal and 430 MHz signal when the initial waveform 105A is 420 MHz and the first LO frequency is 10 MHz. The mixers 105A-D can include double-balanced mixers, single-balanced mixers, unbalanced mixers, and/or any other suitable mixer type. By generating the first generated frequency 105B with two resultant signals and cascading the results of each of the mixers 104A-D into subsequent mixers 104A-D, the mixers 104A-D can generate a signal with exponentially growing series of frequencies across a particular frequency range.

The mixers 104A-D and the local oscillators 103A-D can combine to form one or more sideband generators 111. The sideband generators 111 can be defined as a system that modifies an input signal to generate and output signal. For example, the sideband generators 111 may add signals together to increase the frequency and subtract signals together to decrease the frequency. The sideband generators 111 can expand or reduce the bandwidth of an input signal. For example, the sideband generators 111 can expand the bandwidth of an input signal to reach a bandwidth associated with the communication band of the unmanned aerial vehicle and the communication device. The sideband generators 111 may be replaced with any particular system that modifies the frequency and/or bandwidth of the input signals. For example, the sideband generators 111 may be replaced with a phased locked loop (PLL) multiplier system to produce a higher frequency signal from a lower frequency reference signal. Other forms of frequency multipliers that can be employed by the sideband generators 111 can include but are not limited to step recovery diode (SRD) multipliers, nonlinear transmission line (NLTL) multipliers, Low Noise Odd Order Multipliers, and/or any particular system that increases or decreases the frequency or frequency band of the input signal.

The functionality of the first signal generation system 100 can begin with generating the initial waveform 105A through the carrier oscillator 102A. The carrier oscillator 102A can generate the initial waveform 105A, which can function as a base signal for reproduction. For example, the carrier oscillator 102A can generate an exemplary 2000 MHz initial waveform 105A. The carrier oscillator 102A can input the initial waveform 105A into the sideband generator 111 (also referred to as a front sideband generator 111). The mixer 104A can mix the initial waveform 105A with the first LO frequency of the local oscillator 103A. For example, the mixer 104A can combine an exemplary 20 MHz first LO frequency with the exemplary 2000 MHz initial waveform 105A. The mixer 104A can generate the first generated frequency 105B. The first generated frequency 105B can include two resultant signals, where the first resultant signal is the difference between the initial waveform 105A and the first LO frequency and the second resultant signal is the sum of the initial waveform 105A and the first LO frequency. The first generated frequency 105B can include the initial waveform 105A. For example, the first generated frequency 105B can include a 1980 MHz signal, a 2020 MHz signal, the 2000 MHz signal of the initial waveform 105A, or a combination thereof (e.g., by filtering one or more signals).

The first generated frequency 105B can be input into a second sideband generator 111. For example, a mixer 104B and a local oscillator 103B can combine to form the second sideband generator 111. The mixer 104B can receive the first generated frequency 105B. The mixer 104B can mix the first generated frequency 105B with a second LO frequency generated by the local oscillator 103B. For example, the mixer 104B can mix the exemplary 1980 MHz, 2000 MHz, and 2020 MHz first generated frequency 105B with an exemplary 80 MHz second LO frequency generated by the local oscillator 103B. Continuing this example, the mixer 104B can mix the first generated frequency 105B with the 80 MHz second LO frequency to create six resultant signals. A first three resultant signals can include each signal produced by subtracting the 80 MHz second LO frequency from the three frequencies of the first generated frequency 105B. A second three resultant signals can include each signal produced by adding the 80 MHz second LO frequency to the three frequencies of the first generated frequency 105B. The mixer 104B can generate a second generated frequency 105C. For example, the second generated frequency 105C can include the three frequencies of the first generated frequency 105B, a 1900 MHz signal, a 2060 MHz signal, a 1920 MHz signal, a 2080 MHz signal, a 1940 MHz signal, a 2100 MHz signal, or a combination thereof (e.g., by filtering one or more signals).

The second generated frequency 105C can be input into a third sideband generator 111. For example, a mixer 104C and a local oscillator 103C can combine to form the third sideband generator 111. The mixer 104C can receive the second generated frequency 105C. The mixer 104C can mix the second generated frequency 105C with a third LO frequency generated by the local oscillator 103C. For example, the mixer 104C can mix the exemplary nine frequencies of the second generated frequency 105C with an exemplary 80 MHz third LO frequency generated by the local oscillator 103C. Continuing this example, the mixer 104C can mix the nine frequencies of the second generated frequency 105C with the 80 MHz third LO frequency to generate eighteen resultant signals. A first nine resultant signals can include each signal produced by subtracting the 80 MHz third LO frequency from the nine frequencies of the second generated frequency 105C. A second nine resultant signals can include each signal produced by adding the 80 MHz third LO frequency to the nine frequencies of the second generated frequency 105C. The mixer 104C can generate a third generated frequency 105D. For example, the third generated frequency 105D can include the nine frequencies of the second generated frequency 105C, the first nine resultant signals generated from subtracting the 80 MHz third LO frequency from the nine frequencies of the second generated frequency 105C, the second nine resultant signals generated from adding the 80 MHz third LO frequency to the nine signals of the second generated frequency 105C, or a combination thereof (e.g., by filtering one or more signals).

The third generated frequency 105D can be input into a fourth sideband generator 111. For example, a mixer 104D and a local oscillator 103D can combine to form the fourth sideband generator 111. The mixer 104D can receive the third generated frequency 105D. The mixer 104D can mix the third generated frequency 105D with a fourth LO frequency generated by the local oscillator 103D. For example, the mixer 104D can mix the exemplary twenty-seven frequencies of the third generated frequency 105D with an exemplary 80 MHz fourth LO frequency generated by the local oscillator 103D. Continuing this example, the mixer 104D can mix the twenty-seven frequencies of the third generated frequency 105D with the 80 MHz fourth LO frequency to generate fifty-four resultant signals. A first twenty-seven resultant signals can include signals generated by subtracting the 80 MHz fourth LO frequency from the twenty-seven frequencies of the third generate frequency 105D. A second twenty-seven resultant signals can include the signals generated by adding the 80 MHz LO frequency from the twenty-seven frequencies of the third generated frequency 105D. The mixer 104D can generate the resultant frequency 105E. For example, the resultant frequency 105E can include the twenty-seven frequencies of the third generated frequency 105D, the first twenty-seven resultant signals generated from subtracting the 80 MHz fourth LO frequency from the twenty-seven frequencies of the third generated frequency 105D, the second twenty-seven resultant signals generated from adding the 80 MHz fourth LO frequency to the twenty-seven signals of the third generated frequency 105D, or a combination thereof (e.g., by filtering one or more signals).

The first signal generation system 100 can have more than one sideband generator 111 coupled in series to exponentially "clone" the initial waveform 105A. For example, the first signal generation system 100 can include eight sideband generators 111 coupled in series to process the initial waveform 105A. The resultant frequency 105E can be defined as a duplicated signal from the initial waveform 105A generated by the end sideband generator 111. For example, the resultant frequency 105E with a bandwidth of 320 MHz represents a sixteen multiple expansion of the exemplary 20 MHz initial waveform 105A. The first signal generation system 100 can generate the resultant frequency 105E for propagation towards an unmanned aerial vehicle.

The first signal generation system 100 can include an up/down converter 112. The up/down converter 112 can include the mixer 104E and the carrier oscillator 102B. In the case where the entire bandwidth of the resultant frequency 105E is not necessary for jamming the communication of the unmanned aerial vehicle, the first signal generation system 100 can employ the up/down converter 112 to reduce the bandwidth of the resultant frequency 105E. The up/down converter 112 can include low-pass, high-pass, and band-pass filters to remove harmonics, reduce the bandwidth of the resultant frequency 105E, refine the resultant frequency 105E, and/or adjust the resultant frequency 105E accordingly. The mixer 104E can combine the resultant frequency 105E with a converter signal generated by the carrier oscillator 102B. Similarly to the sideband generators 111, the mixer 104E can add and subtract the resultant frequency 105E and the converter signal according to the desired frequency range of the interference signal 106. For example, the up/down converter 112 can generate an exemplary 120 MHz converter signal to subtract from the exemplary 320 MHz resultant frequency 105E when the interference signal 106 is setup to use or specified to use a bandwidth and/or frequency of 200 MHz. Continuing this example, the low-pass filter can filter out the 420 MHz resultant frequency 105E generated by the mixer 104E and keep the 200 MHz resultant frequency 105E. The interference signal 106 can then be propagated from the first signal generation system 100 to jam the communication of the unmanned aerial vehicle and the communication device.

Figure 2:
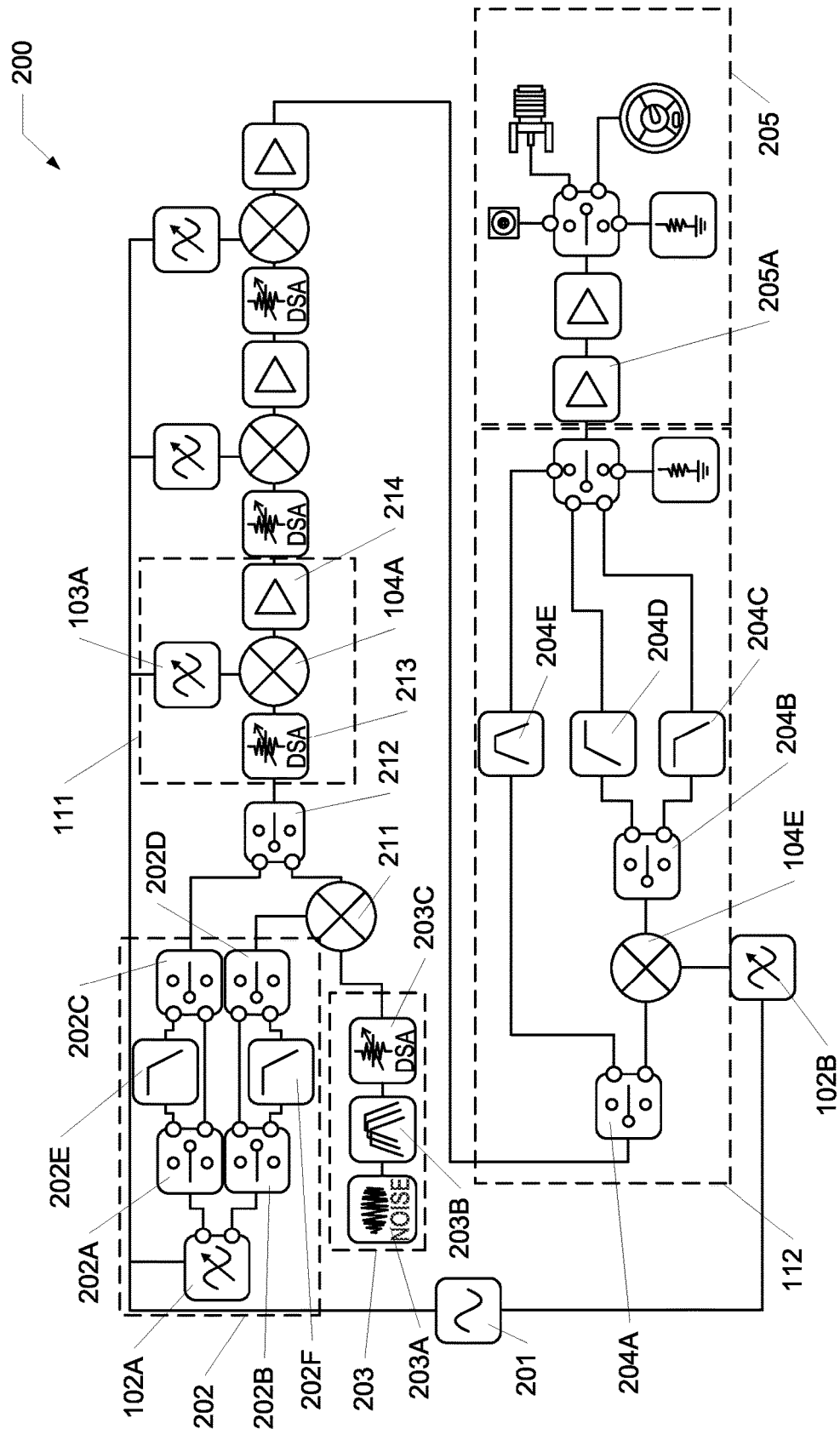
FIG. 2 illustrates an exemplary second signal generation system, according to one embodiment of the present disclosure.

Referring now to FIG. 2, illustrated is a second signal generation system 200, according to one embodiment of the present disclosure. The second signal generation system 200 can be substantially similar to the first signal generation system 100 with expanded detail. For example, the first signal generation system 100 can include all the components and functionalities of the second signal generation system 200. The second signal generation system 200 can illustrate an exemplary complete circuit for generating the interference signal 106.

Generating the interference signal 106 can commence at the control unit 101 (not illustrated). The control unit 101 can configure the carrier oscillators 102A-B, the local oscillators 103A-C, and or any other system of the signal generation system 200. The signal generation system 200 can include a reference clock 201. The reference clock 201 can generate a fixed reference frequency to synchronize the operations of various components of the second signal generation system 200. The reference clock 201 can supply the fixed reference frequency to the carrier oscillators 102A-B, the local oscillators 103A-C, and/or any particular component of the second signal generation system 200. The control unit 101 can configure the carrier oscillators 102A-B and the local oscillators 103A-C to vary the frequency of their generated signals based on the reference clock 201.

An initial waveform generation system 202 can be employed to generate the initial waveform 105A. The initial waveform generation system 202 can include the carrier oscillator 102A, initial switches 202A-B, filters 202E-F, and final switches 202C-D. The initial waveform generation system 202 can manipulate the initial waveform 105A generated by the carrier oscillator 102A for various use cases. For example, the initial waveform generation system 202 can pass the initial waveform 105A through the filter 202E to remove artifacts (errors in the signal) generated by the carrier oscillator 102A.

The carrier oscillator 102A can generate the initial waveform 105A. The carrier oscillator 102A can generate the initial waveform 105A at one or more pins. For example, the carrier oscillator 102A can generate the initial waveform 105A at two pins for transmission to the initial switches 202A-B. The initial switches 202A-B can function substantially similarly. The second signal generation system 200 can employ the switches 202A-B to apply the initial waveform 105A through one or more paths. The initial switches 202A-B can allow the second signal generation system 200 to apply filters to the initial waveform 105A. For example, the initial switch 202A can pass the initial waveform 105A through a wire or the filter 202E. The second signal generation system 200 can employ the initial switch 202A-B to pass the initial waveform 105A through the filters 202E-F if the second signal generation system 200 determines that the initial waveform 105A should be filtered. For example, the second signal generation system 200 can apply the initial waveform 105A through the filters 202E-F to remove undesired harmonic frequencies associated with the initial waveform 105A. In another example, the second signal generation system 200 can apply the filters 202E-F to remove undesired artifacts and/or signal associated with the initial waveform 105A. The filters 202E-F can include any particular type of fixed filters, variable filters, digital filters, analog filters, or a combination thereof. For example, the filters 202E-F can include a variable tenth order Chebyshev low-pass filters with a corner frequency of at least 0 Hz, 0 Hz to 3 GHZ, or less than 3 GHz.

The second signal generation system 200 can engage the initial switch 202B in a substantially similar manner as the initial switch 202A. The final switches 202C-D can follow the engagement of the initial switches 202A-B. For example, the second signal generation system 200 can coordinate the initial switch 202A and the final switch 202C to pass the initial waveform 105A through the wire and bypass the filter 202E. Although illustrated as a low-pass filter, the filters 202E-F can employ any type of filter for the initial waveform 105A (e.g., band-pass filter, low-pass filter, or high-pass filter). The filters 202E-F can be identical filters or dissimilar filters. For example, the filter 202E can include a low-pass filter while the filter 202F can include a high-pass filter. In another example, the filter 202E and the filter 202F can both be high-pass filters with distinct frequency ranges. In another example, the filters 202E-F can include band-pass filters that filter the same frequency ranges.

The initial waveform 105A passed through the initial switch 202B and the final switch 202D can continue towards a mixer 211. The mixer 211 can facilitate combining the initial waveform 105A generated by the initial waveform generation system 202 with noise generated by a noise generator 203 (also referred to as a noise generation circuit). The mixer 211 can receive input signals with frequencies including at least 30 MHz, 30 MHz to 7 GHz, 30 MHz to 3.5 GHz, 3.5 GHz to 7 GHz, or less than 7 GHz.

The noise generator 203 can create noise for incorporation into the initial waveform 105A. The noise generated by the noise generator 203 can increase the likelihood of jamming the communication signal between the unmanned aerial vehicle and the communication device. The noise generator 203 can include a noise source 203A, a filter bank 203B, and a digital signal attenuator 203C. The noise source 203A can generate a noise signal. The noise source 203A can generate white noise, pink noise, brown noise, Gaussian noise, and/or any particular noise type. The noise source 203A can pass the generated noise through the filter bank 203B. The filter bank 203B can include variable low-pass filters, variable band-pass filters, and/or variable high-pass filters to adjust the noise generated by the noise source 203A. For example, the filter bank 203B can filter the noise to the specific frequency and/or frequency band of the initial waveform 105A. The noise is further processed by passing through a digital signal attenuator 203C. The digital signal attenuator 203C can decrease the amplitude and power of the noise. The digital signal attenuator 203C can reduce the amplitude and power of the noise depending on the desired power output of the initial waveform 105A. In another example, the digital signal attenuator 203C can reduce the amplitude and power of the noise to maintain the temperature of the noise generator 203.

The initial waveform 105A combined with the noise generated by the noise generator 203 can propagate to a signal selection switch 212. The second signal generation system 200 can employ the signal selection switch 212 to choose between the initial waveform 105A without noise and the initial waveform 105A with noise. For example, the second signal generation system 200 can choose to jam an unmanned aerial vehicle and its corresponding communication device by incorporating noise into the interference signal 106. The initial waveform 105A or the initial waveform 105A combined with the noise generated by the noise generator 203 passed through the signal selection switch 212 to the sideband generator 111 can be referred to as a selected initial waveform.

In some embodiments, the selection between two or more frequencies at a selection switch 212 can be programmatically determined by software running on a processor circuit. The processor circuit can utilize a GPIO output or other output to programmatically control the selection switch 212. In one embodiment, the selection switch 212 can include one or more switches for manually selecting between one or more pathways, such as, for example, dip switches. In yet another embodiment, the selection switch 212 can include one or more optional circuit segments to select a particular pathway during manufacturing or in the field by soldering. For example, an optional circuit segment can include multiple open pathways that can optionally have a component soldered to the circuit to complete the pathway. One or more optional components can be added to the selection switch 212 to select one or more of a set of pathways. In some embodiment, the component can include one or more of: a resister, a wire, a transitory, a solder bridge, a wire, or other electrical component.

The sideband generators 111 can receive the selected initial waveform (also referred to as an intermediate frequency). The selected initial waveform can be defined as the frequency chosen by the second signal generation system 200 between the initial waveform 105A with noise and the initial waveform 105A without noise. The sideband generators 111 can include the local oscillator 103A, the mixer 104A, a second digital signal attenuator 213, and an amplifier 214. Each of the sideband generators 111 coupled in series can include the components discussed herein.

The second digital signal attenuator 213 can receive the selected initial waveform. The second digital signal attenuator 213 and the digital signal attenuator 203C can function substantially similarly to one another. The second digital signal attenuator 213 can reduce the input amplitude of the input signal received by the one or more sideband generators 111. The second digital signal attenuator 213 can attenuate a signal with a variety of frequency ranges. For example, the second digital signal attenuator 213 can attenuate a signal with a frequency of at least 9 KHz, 9 KHz to 6 GHz, 9 KHz to 3 GHZ, 3 GHz to 6 GHz, and/or less than 6 GHz. The second digital signal attenuator 213 can include an attenuation range of 31.75 dB or any particular range depending on the use case of the second signal generation system 200.

Reducing the amplitude of the input signal received by the one or more sideband generators 111 can be useful for reducing the temperature of the second signal generation system 200. Signals processed with relatively large input amplitudes may generate more heat than signals processed with relatively small input amplitudes. The second signal generation system 200 can determine the amount of attenuation necessary to control the temperature of the sideband generators 111. For example, the second signal generation system 200 can include temperature data that defines a relationship between the output power of the amplifier 214 to the overall temperature of the sideband generator 111. Continuing this example, the second signal generation system 200 can actively monitor the output power of the amplifier 214 and determine if the output power has surpassed a particular threshold. If the output power has surpassed the particular threshold, the second signal generation system 200 can employ the second digital signal attenuator 213 to attenuate the selected initial waveform. In another example, the second signal generation system 200 can include a temperature sensor. The second signal generation system 200 can actively monitor a measured temperature data from the temperature sensor to determine if an initial temperature has surpassed a threshold temperature. If the current temperature surpasses the threshold temperature, the second signal generation system 200 can employ the second digital signal attenuator 213 to attenuate the selected initial waveform or any particular input frequency.

The second digital signal attenuator 213 can send the selected initial waveform to the mixer 104A. The mixer 104A can mix the selected initial waveform with the first LO frequency generated by the local oscillator 103A. The mixer 104A can generate the first generated frequency 105B (not pictured). The first generated frequency 105B can include a sideband mixed signal between the selected initial waveform and the first LO frequency generated by the local oscillator 103A.

The amplifier 214 may receive the first generated frequency 105B from the mixer 104A. The amplifier 214 may increase the amplitude of the first generated frequency 105B. In real-world use, the mixers 104A-E can experience power loss. Power loss from the mixers 104A-E can causes a decrease in the amplitude of the first generated frequency 105B and/or any particular processed signal. To accommodate the losses of the mixer 104A, the amplifier 214 may process the first generated frequency 105B to restore power to the particular signal.

The one or more sideband generators 111 may continue to process the first generated frequency 105B. The end sideband generator 111 can generate the resultant frequency 105E. The resultant frequency 105E can continue to the up/down converter 112. The up/down converter 112 can include the carrier oscillator 102B, the mixer 104E, a first filter switch 204A, a second filter switch 204B, a low-pass filter 204C, a high-pass filter 204D, and a band-pass filter 204E. The up/down converter 112 can facilitate narrowing the bandwidth of the resultant frequency 105E, lowering the frequency of the resultant frequency 105E, or increasing the frequency of the resultant frequency 105E.

The second signal generation system 200 can enable the first filter switch 204A. The first filter switch 204A can allow the resultant frequency 105E to progress either to the mixer 104E or to the band-pass filter 204E. The second signal generation system 200 can determine if the resultant frequency 105E should be band-pass filtered, low-pass filtered, or high-pass filtered. For example, the second signal generation system 200 can enable the first filter switch 204A to divert the resultant frequency 105E to the band-pass filter 204E. Continuing this example, the band-pass filter 204E can filter the resultant frequency 105E to generate the interference signal 106 within a specific frequency range (e.g., 900-928 MHz).

The second signal generation system 200 can employ the mixer 104E to up or down convert the resultant frequency 105E. For example, the mixer 104E may combine the resultant frequency 105E with a shifting signal generated by the carrier oscillator 102B. By mixing the resultant frequency 105E with the shifting signal generated by the carrier oscillator 102B, the mixer 104E may generate a shifted signal. The shifted signal can be defined as a sum or subtraction between the resultant frequency 105E and the shifting signal. For example, the mixer 104E can mix the resultant frequency 105E with the shifting signal to generate the shifted signal. Continuing this example, the shifted signal can include a first signal at the sum of the resultant frequency 105E and the shifting signal and a second signal at the difference between the resultant frequency 105E and the shifting signal. To upshift the resultant frequency 105E, the second signal generation system 200 can employ the second filter switch 204B to pass the shifted frequency through the high-pass filter 204D. The high-pass filter 204D can filter out the second signal of the shifted signal and keep the first signal of the shifted signal to generate the interference signal 106. To downshift the resultant frequency 105E, the second signal generation system 200 can employ the second filter switch 204B to pass the shifted frequency through the low-pass filter 204C. The low-pass filter 204C can filter out the first signal of the shifted signal and keep the second signal of the shifted signal to generate the interference signal 106.

The second signal generation system 200 can include a transmitter 205. The transmitter 205 can transmit the interference signal 106 to an antenna for propagation towards the targeted unmanned aerial vehicle. The transmitter 205 can include amplifiers 205A for amplifying the interference signal 106 before transmission.

Figure 3:
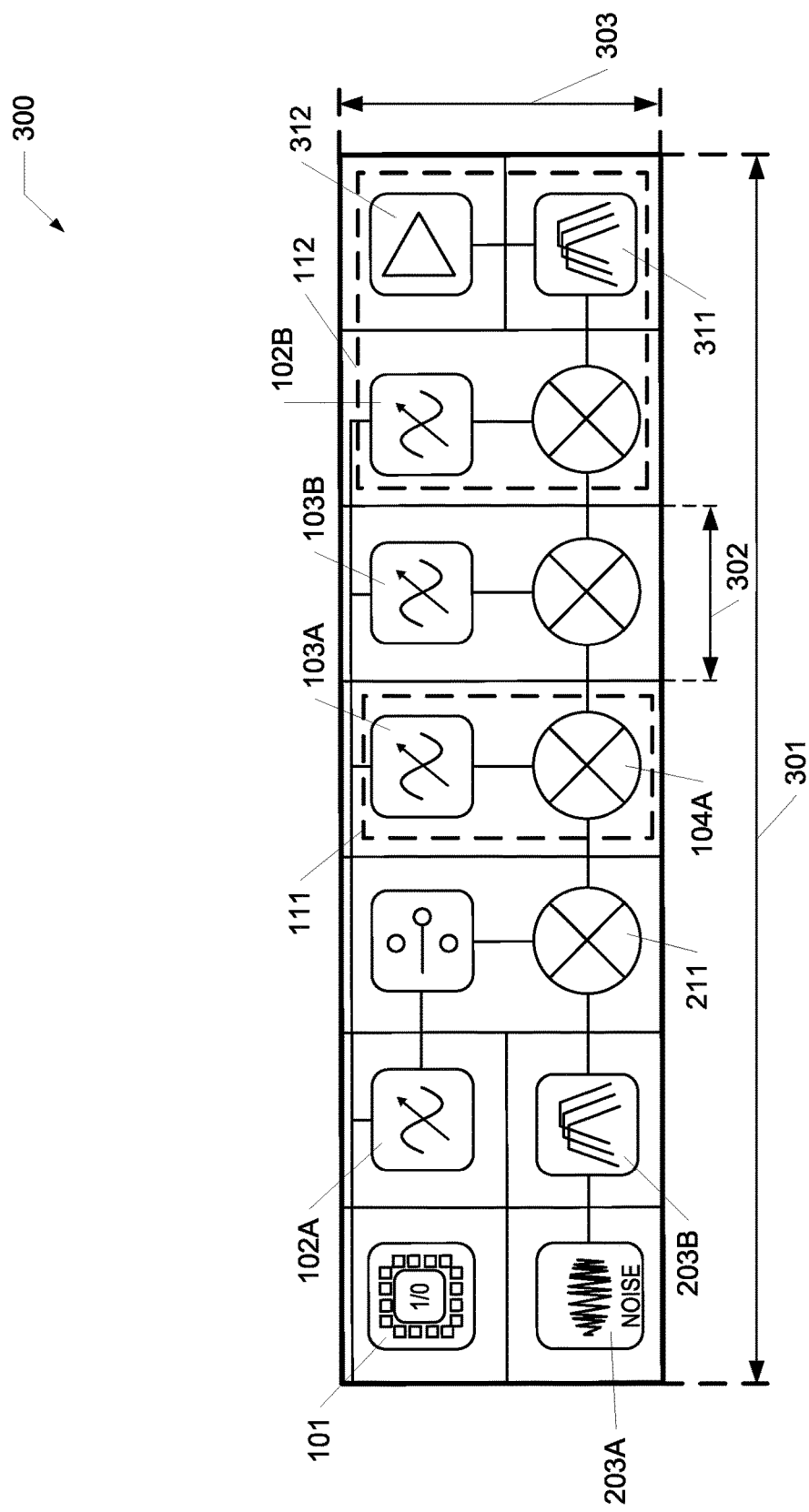
FIG. 3 illustrates an exemplary third signal generation system, according to one embodiment of the present disclosure.

Referring now to FIG. 3 illustrated is a third signal generation system 300, according to one embodiment of the present disclosure. The third signal generation system 300 can be substantially similar to the second signal generation system 200. For example, the third signal generation system 300 may include all the components and functionalities as the second signal generation system 200, and vise-versa. In another example, the third signal generation system 300 can include one or more of the components of the second signal generation system 200 and one or more of the same functionalities, and vise-versa. For example, the third signal generation system 300 can represent a condensed version of the second signal generation system 200. Although not illustrating every component of the second signal generation system 200, it is understood that the third signal generation system 300 can include all the components of the second signal generation system 200.

The third signal generation system 300 can include a first length 301, a second length 302, and a height 303. The first length 301 can measure the complete length of the third signal generation system 300. The first length 301 can measure at least 100 mm, 100 mm to 210 mm, 100 mm to 140 mm, 140 mm, 140 mm to 210 mm, or less than 210 mm. The second length 302 can measure the length of one particular component of the third signal generation system 300. The third signal generation system 300 can be divided into 7 sections each of which are equivalent in length to the second length 302. The second length 302 can measure at least 10 mm, 10 mm to 30 mm, 10 mm to 20 mm, 20 mm, 20 mm to 30 mm, or less than 30 mm. The height 303 may measure the total height of the third signal generation system 300. The height 303 may measure at least 20 mm, 20 mm to 50 mm, 20 mm to 30 mm, 30 mm to 34 mm, 34 mm, 34 mm to 40 mm, 40 mm to 50 mm, or less than 50 mm. The total area of the third signal generation system 300 may measure at least 20.0 cm2, 20.0 cm2 to 60.0 cm2, 20.0 cm2 to 40.0 cm2, 40.0 cm2 to 47.6 cm2, 47.6 cm2, 47.6 cm2 to 60.0 cm2, or less than 60.0 cm2.

The third signal generation system 300 can include the control unit 101. The control unit 101 can perform the processing functionalities of the third signal generation system 300. For example, the control unit 101 may connect with each component of the third signal generation system 300 to control the particular component. The control unit 101 can include the clock circuit to generate the reference clock. The control unit 101 can transmit the reference clock to the carrier oscillator 102B and the local oscillators 103A-B. The control unit 101 can facilitate generating complex output shaping jamming techniques. For example, the third signal generation system 300 can employ the control unit 101 and the other components of the third signal generation system 300 to preform barrage jamming, tone jamming, sweep jamming, spot jamming, noise jamming, and/or any particular jamming technique for disabling the unmanned aerial vehicle. In another example, the third signal generation system 300 can perform narrow-band jamming or comb jamming. Comb jamming can be defined as jamming frequencies across various ranges. The third signal generation system 300 can employ comb jamming to jam one or more specific communications employed by the uncrewed aircraft system while avoiding disturbances to communications performed by other surrounding technologies.

The third signal generating system 300 may include the carrier oscillator 102A. The carrier oscillator 102A can function as a continuous wave (CW) signal source. The carrier oscillator 102A can function as the local oscillator for the mixer 211. The carrier oscillator 102A can generate ramping waveforms, frequency-shift keying (FSK) waveforms, and phase-shift keying (PSK) waveforms. For example, the carrier oscillator 102A can generate a ramping waveform to combine with the noise generated by the noise source 203A. The carrier oscillator 102A can generate the initial waveform 105A to pass through the mixer 211. The mixer 211 can combine the noise generated by the noise source 203A with the initial waveform 105A. The mixer 211 can select between the initial waveform 105A and the noise generated by the noise source 203A. For example, the mixer 211 can facilitate bypassing the noise. In another example, the mixer 211 can facilitate upconverting the noise with the initial waveform 105A.

The noise source 203A can generate noise signals with a band width of at least 10 MHZ, 10 MHz to 400 MHz, 10 MHz to 100 MHz, 100 MHz to 200 MHz, 200 MHZ, 200 MHz to 300 MHz, 300 MHz to 400 MHz, or less than 400 MHz. The noise source 203A may include a digitally adjustable bias control. The digitally adjustable bias control may determine the output shape and flatness of the generated noise. For example, the control unit 101 may connect to and control the noise source 203A. The control unit 101 can adjust the bias of the noise source 203A to increase or decrease the shape and/or flatness of the generated noise.

The noise source 203A may send the generated noise through the filter bank 203B. The filter bank 203B can adjust the bandwidth of the generated noise. The filter bank 203B can be a variable filter bank controlled by the control unit 101. The filter bank 203B can have a continuous set of bandpass filters that can be applied to the generated noise. The filter bank 203B can include a discrete number of bandpass filters that can be applied to the generated noise. The control unit 101 can determine and apply the type of filter used to process the generated noise from the filter bank 203B. For example, the control unit 101 can determine the bandwidth of the communication employed by the unmanned aerial vehicle and pass the generated noise through a filter from the filter bank 203B with a similar bandwidth. The filter bank 203B can define the minimum bandwidth of the interference signal 106.

The sideband generators 111 can receive the initial waveform 105A or the initial waveform 105A mixed with the generated noise. The second signal generation system 200 can include two sideband generators 111. The two sideband generators 111 can be coupled in series to increase the bandwidth of the initial waveform 105A and/or the initial waveform 105A mixed with the generated noise. The sideband generators 111 can generate one or more generated frequencies. The generated frequencies can be exponential clones of the initial waveform 105A and/or the initial waveform 105A mixed with the generated noise. The sideband generators 111 can function in the third signal generation system 300 substantially similarly as they function in the second signal generation system 200 and the first signal generation system 100. The sideband generators 111 can perform bandwidth adjustments and output shaping of each generated frequency.

The end sideband generator 111 can send the resultant frequency 105E (not pictured) to the up/down converter 112. The up/down converter 112 can upshift or downshift the frequency of the resultant frequency 105E. The up/down converter 112 can function substantially similarly in the third signal generation system 300 as compared to the second signal generation system 200 and/or the first signal generation system 100. The up/down converter 112 can shift the resultant frequency 105E up to at least 5 GHz, 5 GHz to 6 GHz, 5.8 GHz, or less than about 6 GHz. The up/down converter 112 can shift the resultant frequency 105E down to at least 300 Hz, 300 Hz to 500 Hz, 400 Hz, or less than 500 Hz. The up/down converter 112 can shift the resultant frequency 105E in any particular direction by any particular amount, depending on the desired interference signal 106 for jamming the communication of the particular unmanned aerial vehicle.

The up/down converter 112 can include a converter filter bank 311 and an amplifier 312. The converter filter bank 311 can function similarly to the low-pass filter 204C, the high-pass filter 204D, and the band-pass filter 204E. The control unit 101 can control the converter filter bank 311 based on the desired conversion of the resultant frequency 105E. For example, the control unit can configure the converter filter bank 311 to process the resultant frequency 105E using a low-pass filter to generate an interference signal 106, where the interference signal 106 is a downshifted signal of the resultant frequency 105E. In another example, the control unit can configure the converter filter bank 311 to process the resultant frequency 105E using a high-pass filter to generate the interference signal 106, where the interference signal 106 is a upshifted signal of the resultant frequency 105E. The amplifier 312 may be employed to vary the gain (e.g., power) of the interference signal 106. The third signal generation system 300 can employ the amplifier 312 to maintain thermal requirements. For example, the third signal generation system 300 can include a temperature probe. Continuing this example, the third signal generation system 300 can reduce the power through the amplifier 312 if the temperature probe measures a temperature at or above a threshold temperature. The amplifier 312 may include similar temperature mitigation techniques as the second digital signal attenuators 213.

Figure 4:
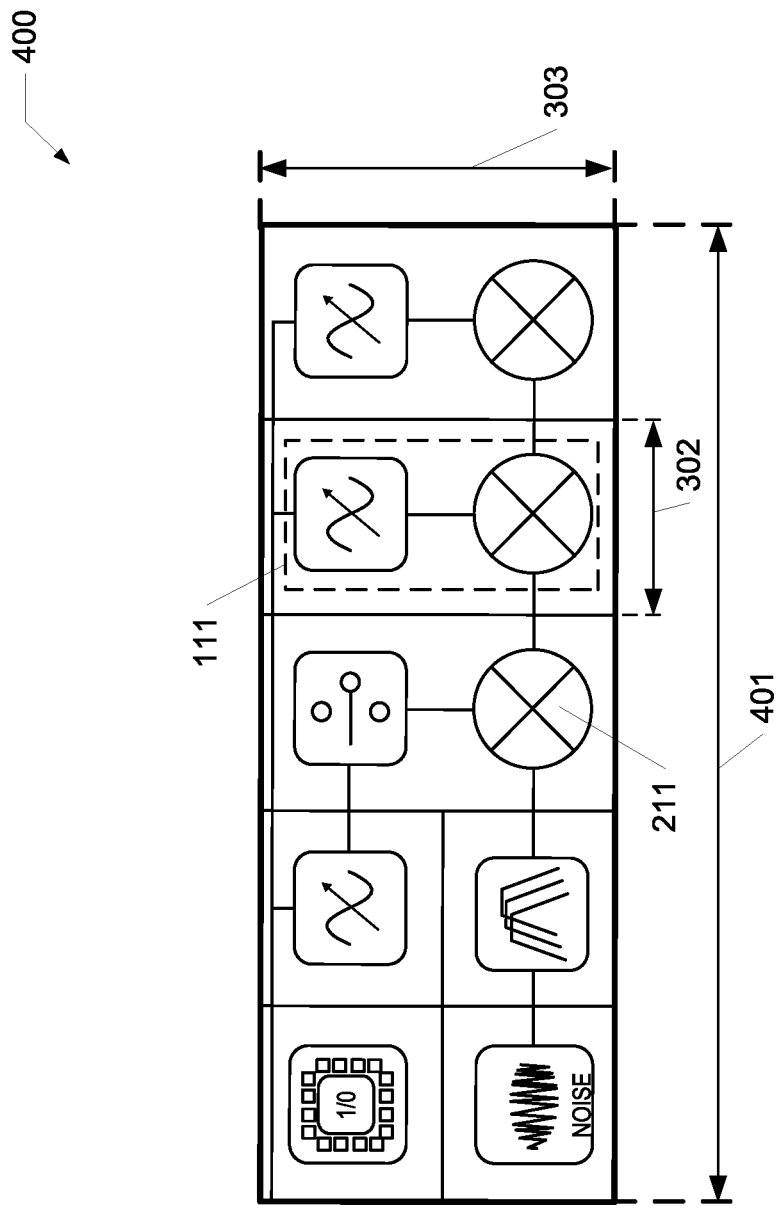
FIG. 4 illustrates an exemplary fourth signal generation system, according to one embodiment of the present disclosure.

Referring now to FIG. 4, illustrated is a fourth signal generation system 400, according to one embodiment of the present disclosure. The fourth signal generation system 400 can be substantially similar to the second signal generation system 200 or the third signal generation system 300. For example, the fourth signal generation system 400 may include all the components and functionalities as the third signal generation system 300, and vise-versa. In another example, the fourth signal generation system 400 can include one or more of the components of the third signal generation system 300 and one or more of the same functionalities, and vise-versa. For example, the fourth signal generation system 400 can represent an abridged version of the second signal generation system 200, although capable of performing one or more of the same functionalities.

The fourth signal generation system 400 can include a first length 401, the second length 302, and the height 303. The first length 401 can measure the complete length of the fourth signal generation system 400. The first length 401 can measure at least 50 mm, 50 mm to 150 mm, 50 mm to 100 mm, 100 mm, 100 mm to 150 mm, or less than 150 mm. The second length 302 can measure the length of one particular component of the fourth signal generation system 400. The fourth signal generation system 400 can be divided into 5 sections each of which are equivalent in length to the second length 302. The second length 302 can measure at least 10 mm, 10 mm to 30 mm, 10 mm to 20 mm, 20 mm, 20 mm to 30 mm, or less than 30 mm. The height 303 may measure the total height of the fourth signal generation system 400. The height 303 may measure at least 20 mm, 20 mm to 50 mm, 20 mm to 30 mm, 30 mm to 34 mm, 34 mm, 34 mm to 40 mm, 40 mm to 50 mm, or less than 50 mm. The total area of the fourth signal generation system 400 may measure at least 10.0 cm2, 10.0 cm2 to 50.0 cm2, 10.0 cm2 to 30.0 cm2, 30.0 cm2 to 32.0 cm2, 32.0 cm2, 32.0 cm2 to 50.0 cm2, or less than 50.0 cm2.

The fourth signal generation system 400 can include two sideband generators 111. The two sideband generators can receive the initial waveform 105A or the initial waveform 105A mixed with the generated noise from the mixer 211. The two sideband generators 111 can exponentially clone the initial waveform 105A to increase the bandwidth of the particular signal. The fourth signal generation system 400 can generate interference signals 106 within particular ranges. For example, the fourth signal generation system 400 can be manufactured to generate interference signals 106 within the range of 2-6 GHZ, 1.2-1.6 GHz, 0.4-1.0 GHz, and/or any particular range of frequencies.

Figure 5:
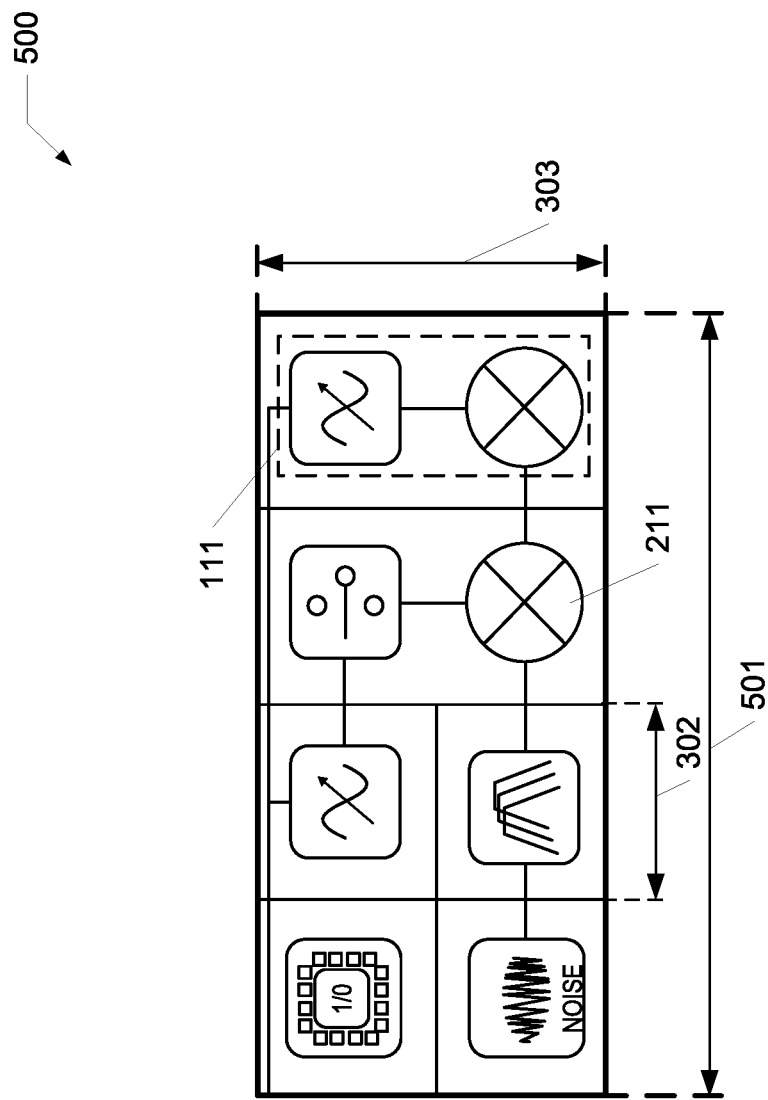
FIG. 5 illustrates an exemplary fifth signal generation system, according to one embodiment of the present disclosure.

Referring now to FIG. 5, illustrated is a fifth signal generation system 500, according to one embodiment of the present disclosure. The fifth signal generation system 500 can be substantially similar to the second signal generation system 200, the third signal generation system 300, and/or the fourth signal generation system 400. For example, the fifth signal generation system 500 may include all the components and functionalities as the fourth signal generation system 400, and vise-versa. In another example, the fourth signal generation system 400 can include one or more of the components of the second signal generation system 200 and one or more of the same functionalities, and vise-versa. For example, the fifth signal generation system 500 can represent an abridged version of the second signal generation system 200, although capable of performing one or more of the same functionalities.

The fifth signal generation system 500 can include a first length 501, the second length 302, and the height 303. The first length 501 can measure the complete length of the fourth signal generation system 400. The first length 401 can measure at least 30 mm, 30 mm to 130 mm, 30 mm to 80 mm, 80 mm, 80 mm to 130 mm, or less than 130 mm. The second length 302 can measure the length of one particular component of the fifth signal generation system 500. The fifth signal generation system 500 can be divided into 4 sections, each of which are equivalent in length to the second length 302. The second length 302 can measure at least 10 mm, 10 mm to 30 mm, 10 mm to 20 mm, 20 mm, 20 mm to 30 mm, or less than 30 mm. The height 303 may measure the total height of the fifth signal generation system 500. The height 303 may measure at least 20 mm, 20 mm to 50 mm, 20 mm to 30 mm, 30 mm to 34 mm, 34 mm, 34 mm to 40 mm, 40 mm to 50 mm, or less than 50 mm. The total area of the fifth signal generation system 500 may measure at least 10.0 cm2, 10.0 cm2 to 50.0 cm2, 10.0 cm2 to 30.0 cm2, 30.0 cm2 to 26.0 cm2, 26.0 cm2, 26.0 cm2 to 50.0 cm2, or less than 50.0 cm2.

The fifth signal generation system 500 can include one sideband generator 111. The fifth signal generation system 500 can duplicate the initial waveform 105A once to generate the interference signal 106. The fifth signal generation system 500 can have a smaller total area as compared to the second signal generation system 200, the third signal generation system 300, and the fourth signal generation system 400.

Figure 6:
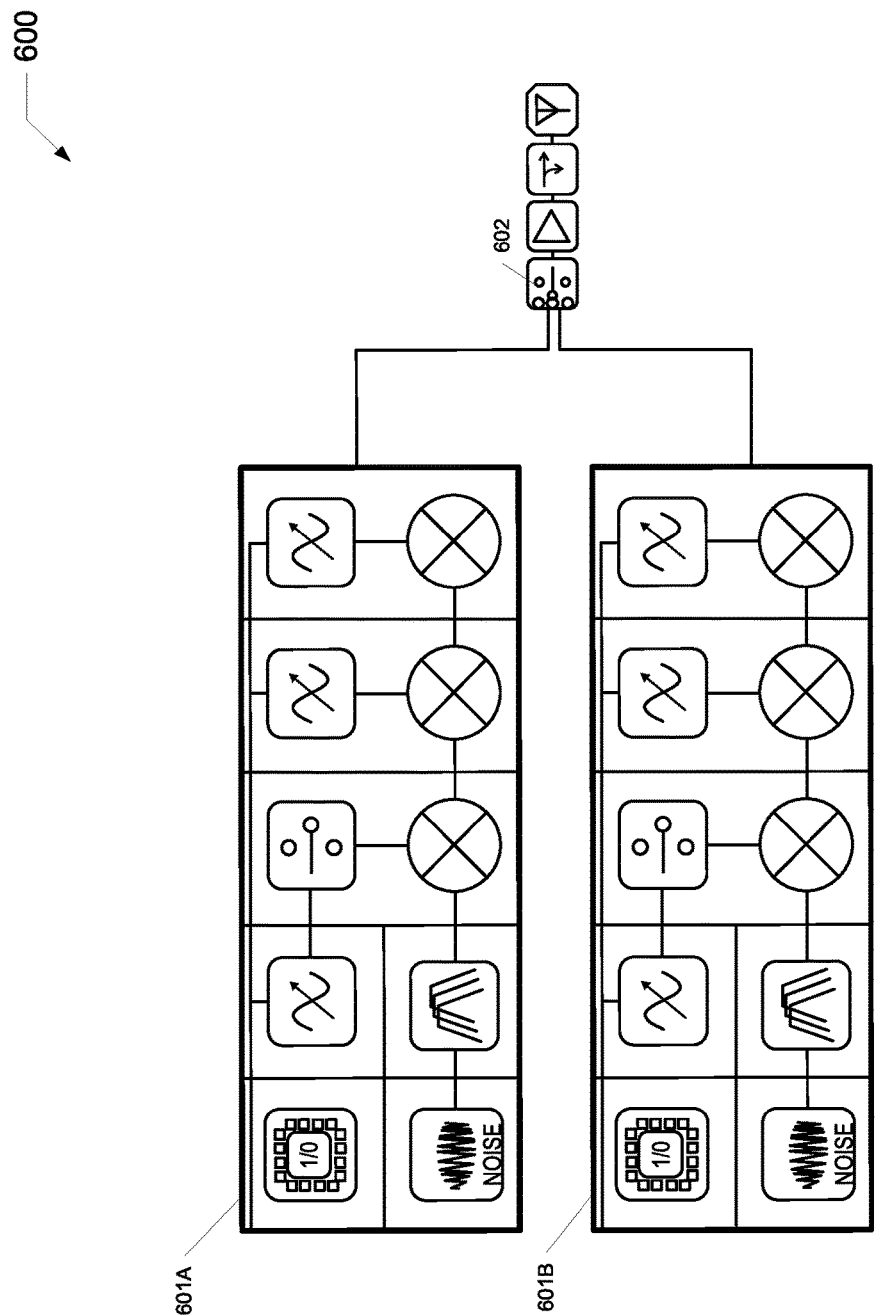
FIG. 6 illustrates an exemplary double-buffered signal generation system, according to one embodiment of the present discourse.

Referring now to FIG. 6, illustrated is an exemplary double-buffered signal generation system 600, according to one embodiment of the present disclosure. The double-buffered signal generation system 600 can include two or more buffered signal generation systems 601A-B connected in parallel. For example, the exemplary double-buffered signal generation system 600 can include the two buffered signal generation systems 601A-B, which are substantially similar to the fourth signal generation systems 400. The double-buffered signal generation system 600 can include one or more of the second signal generation systems 200, one or more of the third signal generation systems 300, one or more of the fourth signal generation system 400, one or more of the fifth signal generation system 500, or any combination thereof. The double-buffered signal generation system 600 can function as a switching system to instantaneously output various interference signals 106. For example, in real-world use, either of the buffered signal generation systems 601A-B may need to be reconfigured to a different frequency or frequency range to combat the targeted unmanned aerial vehicle. Reconfiguring the buffered signal generation systems 601A-B and/or any particular signal generation system may take a set amount of time. As the set amount of time elapses the unmanned aerial vehicle can continue communicating with the communication device and return to the communication device. The double-buffered signal generation system 600 can include the two or more buffered signal generation systems 601A-B to constantly produce interference signals 106 at different frequencies and/or frequency ranges.

In a typical use case scenario, the double-buffered signal generation system 600 can have two or more buffered signal generation systems 601A-B. The buffered signal generation systems 601A-B can actively generate two interference signals 106 simultaneously. The double-buffered signal generation system 600 can employ a switch 602 to select the interference signal 106 generated by the buffered signal generation systems 601A-B. For example, the double-buffered signal generation system 600 can switch from a first interference signal generated by the buffered signal generation system 601A to a second interference signal generated by the buffered signal generation system 601B, and vise-versa. The double-buffered signal generation system 600 can switch between interference signals 106 depending on the identified communication bands of the unmanned aerial vehicle and the communication device.

Figure 7A:
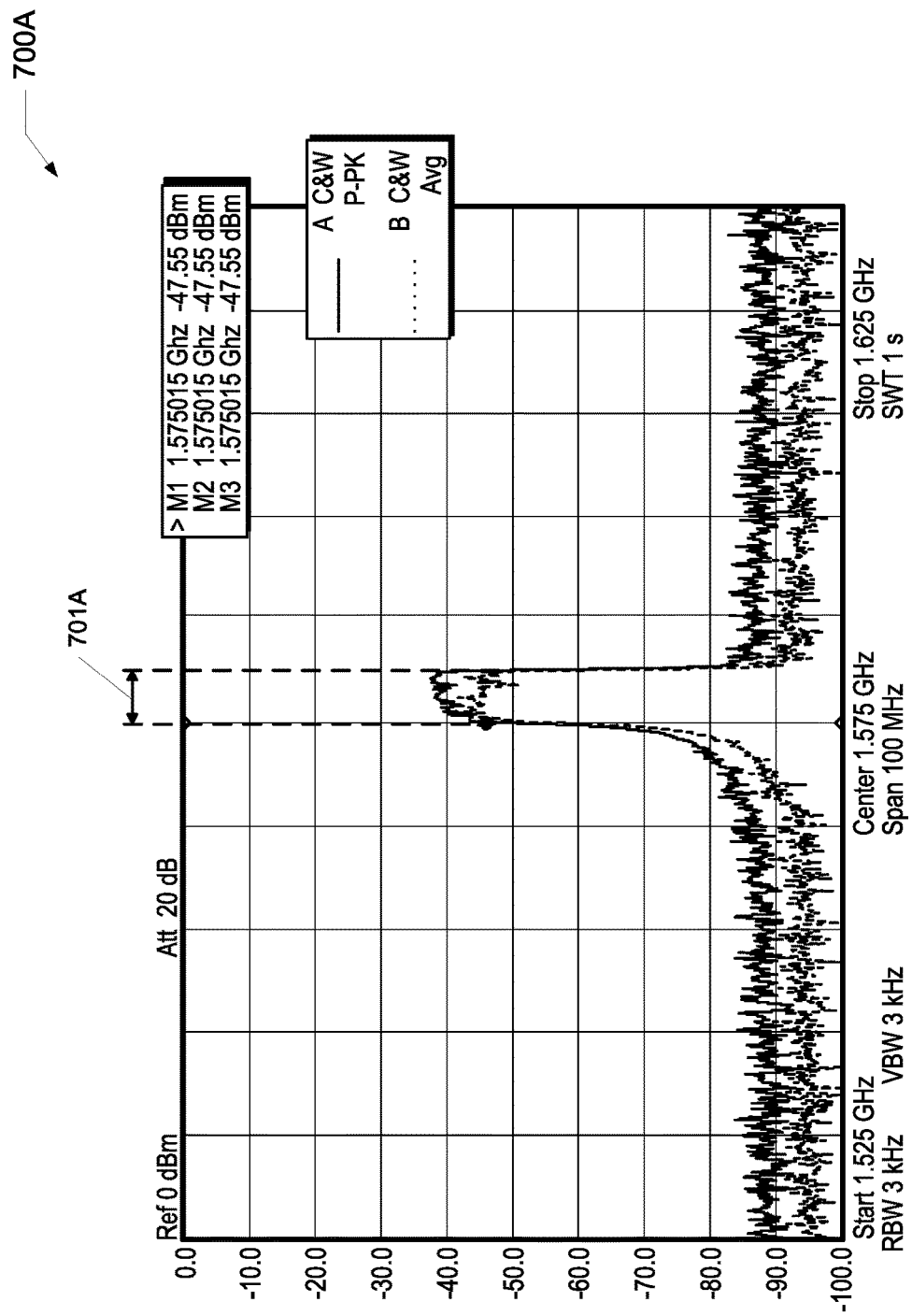
FIGS. 7A-C illustrate exemplary generated signals, according to one embodiment of the present disclosure.
Figure 7B:
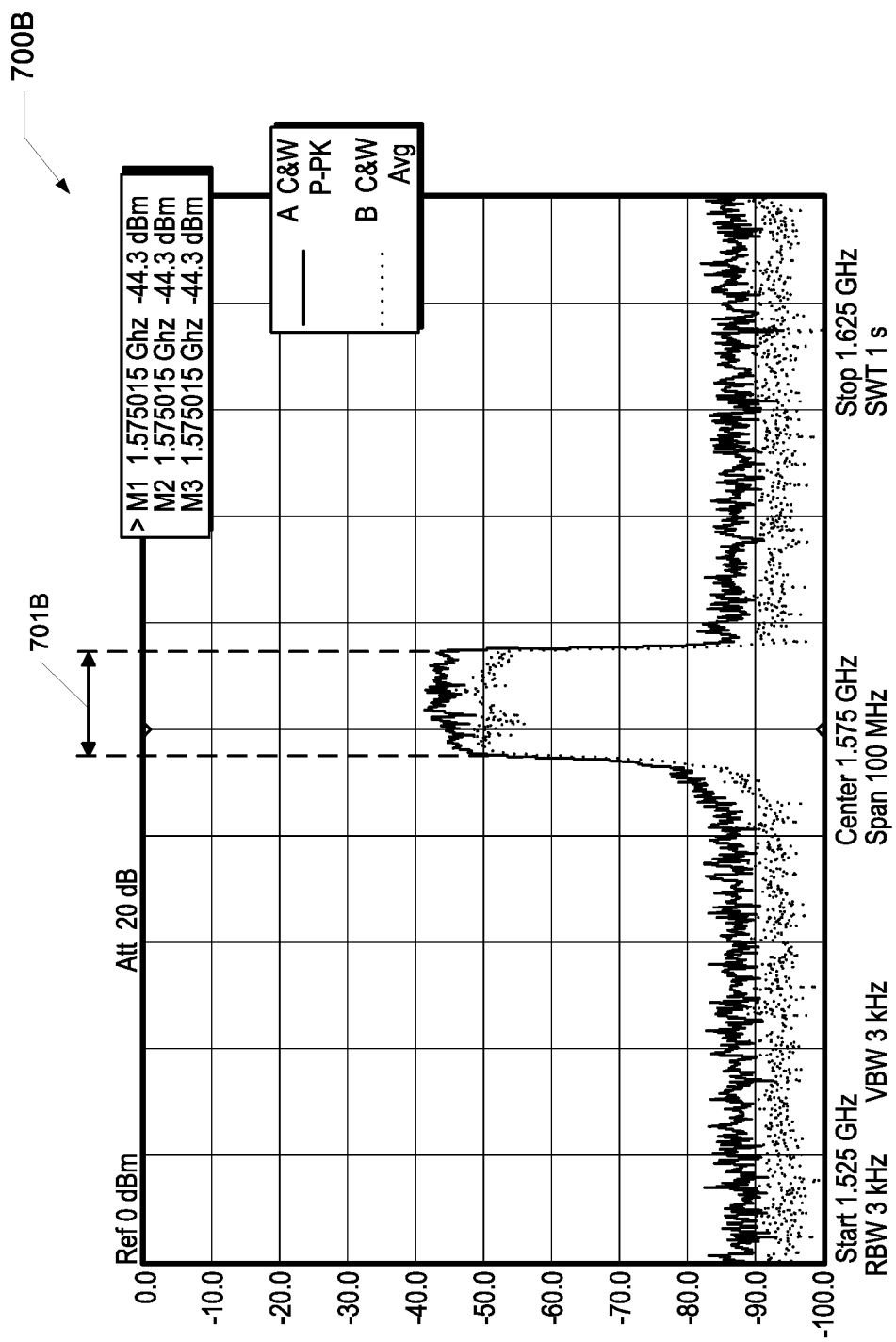
Figure 7C:
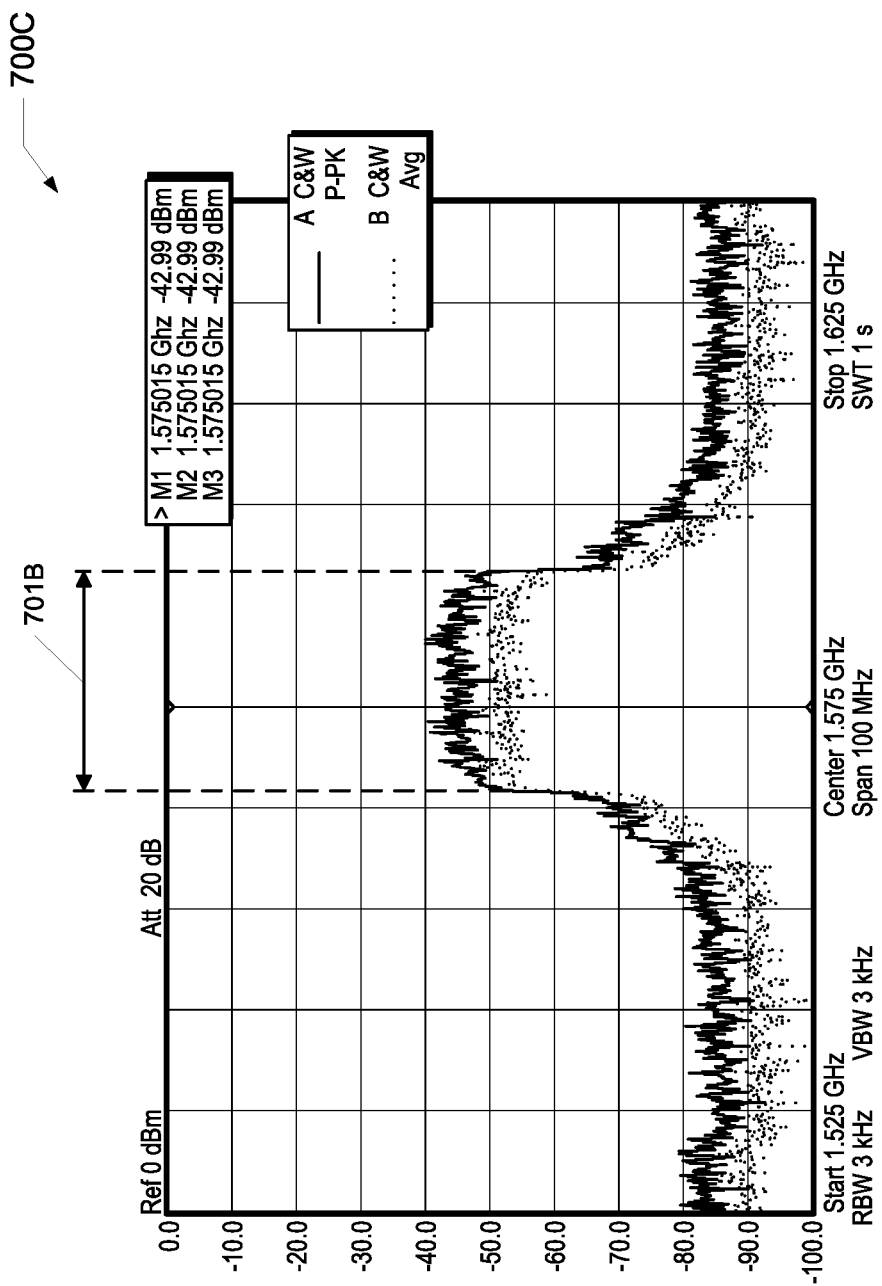

Referring now to FIGS. 7A-C, illustrated are exemplary generated signals 700A-C, according to one embodiment of the present disclosure. The exemplary generated signals 700A-C may represent signals generated by the one or more sideband generators 111, carrier oscillators 102A-B, and/or the up/down converter 112. For example, the generated signal 700A may correspond with the initial waveform 105A generated by the carrier oscillator 102A. Continuing this example, the generated signal 700B may correspond with the first generated frequency 105B. Further continuing this example, the generated signal 700C can correspond with the second generated frequency 105C. the generated signals 700A-C can illustrate the exponential growth of the initial waveform 105A through the sideband generators 111.

The generated signal 700A can include a bandwidth 701A. The bandwidth 701A can represent the frequency range of the generated signal 700A. The bandwidth 701A can measure 5 MHz, although any particular bandwidth may be present depending on the initial waveform 105A generated by the carrier oscillator 102A. The generated signal 700B can include a bandwidth 701B. The bandwidth 701B can represent the frequency range of the generated signal 700B. The bandwidth 701B can measure 10 MHz, although any particular bandwidth may be present depending on the initial waveform 105A. The bandwidth 701B can measure double the bandwidth 701A. The generated signal 700C can include a bandwidth 701C. The bandwidth 701C can represent the frequency range of the generated signal 700C. The bandwidth 701C can measure 20 MHz, though any particular bandwidth may be present depending on the initial waveform 105A. The bandwidth 701C can measure double the bandwidth 701B and quadruple the bandwidth 701C. The change in between the bandwidth 701A-C may represent an exponential growth by the sideband generators 111 of the initial waveform 105A.

Figure 8:
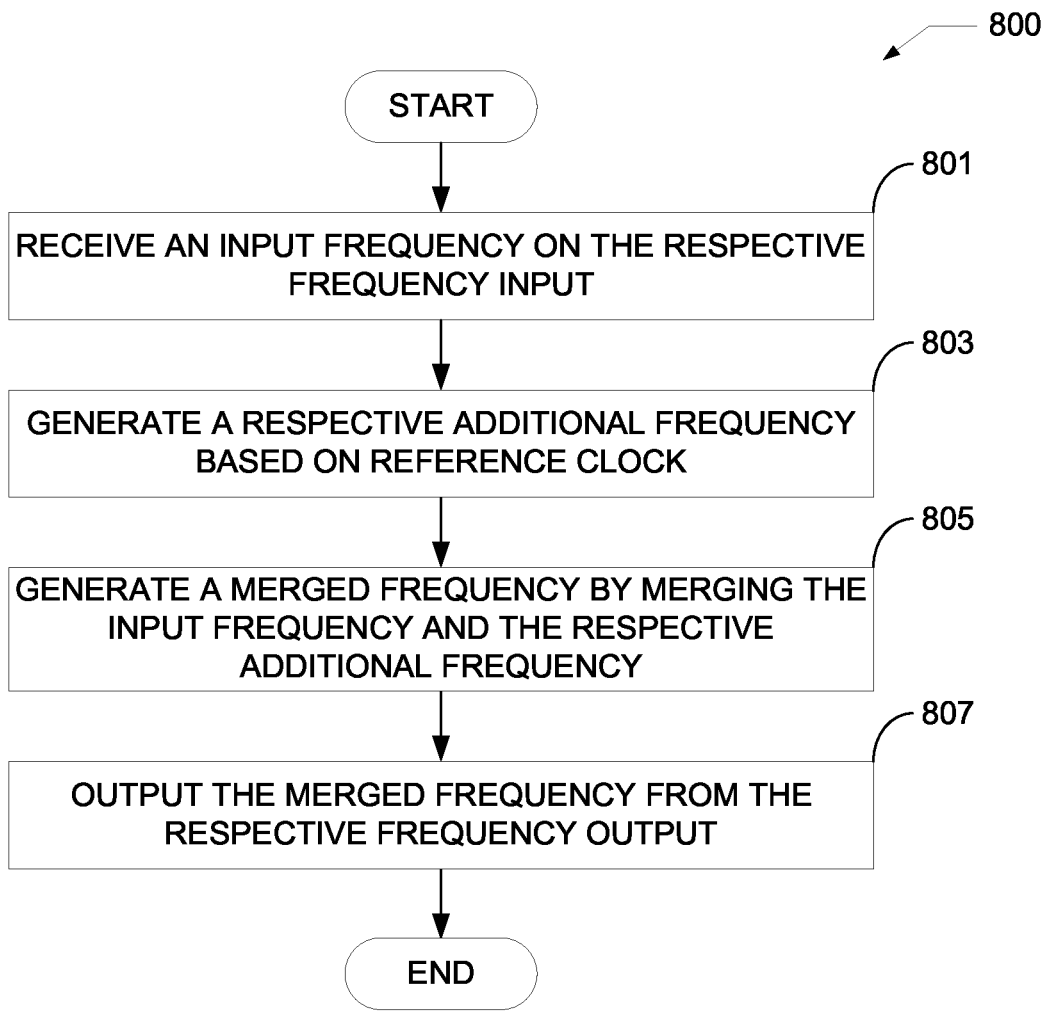
FIG. 8 illustrates a flowchart of a process, according to one embodiment of the present disclosure.

Referring now to FIG. 8, illustrated is a flowchart of the process 800, according to one embodiment of the present disclosure. The process 800 can represent a technique for expanding the initial waveform 105A through the one or more sideband generators 111 (also referred to signal expansion circuits).

At box 801, the process 800 can include receiving an input frequency on a respective frequency input. The sideband generator 111 can receive the input frequency (e.g., initial waveform 105A) at the frequency input of the mixer 104A or the second digital signal attenuator 213. For example, the sideband generator 111 can receive the initial waveform 105A at the frequency input of the mixer 104A if the second digital signal attenuator 213 is excluded. In another example, the sideband generator 111 can receive the initial waveform 105A at the second digital signal attenuator 213 when included. The input frequency can correspond with the selected initial waveform passed through the selected signal selection switch 212. For example, the selected initial waveform can include the initial waveform 105A and/or the initial waveform 105A mixed with noise generated by the noise generator 203.

At box 803, the process 800 can include generating a respective additional frequency based on the reference clock. The sideband generator 111 can employ the local oscillator 103A to generate the respective additional frequency (e.g., the first LO frequency) based on the reference frequency of the clock circuit of the control unit 101. The local oscillator 103A may generate the first LO frequency 90 degrees out of phase as compared to the selected initial waveform. By shifting the first LO frequency 90 degrees out of phase relative to the selected initial waveform, the mixer 104A can exclude (or similar referred to as canceling out) the direct current (DC) signal component of the first generated frequency 105B.

At box 805, the process 800 can include generating a merged frequency by merging the input frequency and the respective initial waveform. The sideband generator may employ the mixer 104A to mix the input frequency (e.g., the selected initial waveform) with the respective additional frequency (e.g., the first LO frequency) to form the first generated frequency 105B. The mixer 104A can include a double balanced mixer used to combine two signals to generate a signal with a frequency at the sum of the two signals and a frequency at the positive difference of the two signals. For example, the mixer 104A can mix the first LO frequency with the selected initial waveform to generate the first generated frequency 105B with a frequency at the sum of the first LO frequency and the selected input frequency. Continuing this example, the mixer 104A can mix the first LO frequency with the selected initial waveform to generate the first generated frequency 105B with a frequency at the value produced by subtracting the first LO frequency from the selected initial waveform. The mixer 104A can generate the first generated frequency 105B double that of the selected initial waveform when the first LO frequency and selected initial waveform are equivalent in frequency. For example, the sum of the first LO frequency and the selected initial waveform can lead to the first generated frequency equaling a frequency double that of the selected initial waveform when the first LO frequency equals the selected initial waveform.

At box 807, the process 800 includes outputting the merged frequency from the respective frequency output. The sideband generator 111 can output the merged frequency (e.g., the first generated frequency 105B) through the respective frequency output (e.g., the output of the amplifier 214). The respective frequency output can include the output of the amplifier 214 or the output of the mixer 104A. The amplifier 214 can amplify the sideband mixed signal generated by the mixer 104A to generate the first generated frequency 105B. The amplifier 214 amplifies the sideband mixed signal to generate the first generated frequency 105B to restore power lost during the mixing process of the mixer 104A.

From the foregoing, it will be understood that various aspects of the processes described herein are software processes that execute on computer systems that form parts of the system. Accordingly, it will be understood that various embodiments of the system described herein are generally implemented as specially-configured computers including various computer hardware components and, in many cases, significant additional features as compared to conventional or known computers, processes, or the like, as discussed in greater detail herein. In some embodiments, the functionality can be implemented in hardware including, for example, in a field-programmable gate array (FPGA), an application-specific integrated circuit (ASIC), in hardware circuitry, or implemented in hardware via VHDL or Verilog hardware language. Embodiments within the scope of the present disclosure also include computer-readable media for carrying or having computer-executable instructions or data structures stored thereon. Such computer-readable media can be any available media which can be accessed by a computer, or downloadable through communication networks. By way of example, and not limitation, such computer-readable media can comprise various forms of data storage devices or media such as RAM, ROM, flash memory, EEPROM, CD-ROM, DVD, or other optical disk storage, magnetic disk storage, solid-state drives (SSDs) or other data storage devices, any type of removable nonvolatile memories such as secure digital (SD), flash memory, memory stick, etc., or any other medium which can be used to carry or store computer program code in the form of computer-executable instructions or data structures and which can be accessed by a general-purpose computer, special purpose computer, specially-configured computer, mobile device, etc.

When information is transferred or provided over a network or another communications connection (either hardwired, wireless, or a combination of hardwired or wireless) to a computer, the computer properly views the connection as a computer-readable medium. Thus, any such a connection is properly termed and considered a computer-readable medium. Combinations of the above should also be included within the scope of computer-readable media. Computer-executable instructions comprise, for example, instructions and data which cause a general-purpose computer, special purpose computer, or special purpose processing device such as a mobile device processor to perform one specific function or a group of functions.

Those skilled in the art will understand the features and aspects of a suitable computing environment in which aspects of the disclosure may be implemented. Although not required, some of the embodiments of the claimed innovations may be described in the context of computer-executable instructions, such as program modules or engines, as described earlier, being executed by computers in networked environments. Such program modules are often reflected and illustrated by flow charts, sequence diagrams, exemplary screen displays, and other techniques used by those skilled in the art to communicate how to make and use such computer program modules. Generally, program modules include routines, programs, functions, objects, components, data structures, application programming interface (API) calls to other computers whether local or remote, etc. that perform particular tasks or implement particular defined data types, within the computer. Computer-executable instructions, associated data structures and/or schemas, and program modules represent examples of the program code for executing steps of the methods disclosed herein. The particular sequence of such executable instructions or associated data structures represents examples of corresponding acts for implementing the functions described in such steps.

Those skilled in the art will also appreciate that the claimed and/or described systems and methods may be practiced in network computing environments with many types of computer system configurations, including personal computers, smartphones, tablets, hand-held devices, multi-processor systems, microprocessor-based or programmable consumer electronics, networked PCs, minicomputers, mainframe computers, and the like. Embodiments of the claimed innovation are practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing various aspects of the described operations, which is not illustrated, includes a computing device including a processing unit, a system memory, and a system bus that couples various system components including the system memory to the processing unit. The computer will typically include one or more data storage devices for reading data from and writing data to. The data storage devices provide nonvolatile storage of computer-executable instructions, data structures, program modules, and other data for the computer.

Computer program code that implements the functionality described herein typically comprises one or more program modules that may be stored on a data storage device. This program code, as is known to those skilled in the art, usually includes an operating system, one or more application programs, other program modules, and program data. A user may enter commands and information into the computer through keyboard, touch screen, pointing device, a script containing computer program code written in a scripting language, or other input devices (not shown), such as a microphone, etc. These and other input devices are often connected to the processing unit through known electrical, optical, or wireless connections.

The computer that affects many aspects of the described processes will typically operate in a networked environment using logical connections to one or more remote computers or data sources, which are described further below. Remote computers may be another personal computer, a server, a router, a network PC, a peer device or other common network node, and typically include many or all of the elements described above relative to the main computer system in which the innovations are embodied. The logical connections between computers include a local area network (LAN), a wide area network (WAN), virtual networks (WAN or LAN), and wireless LANs (WLAN) that are presented here by way of example and not limitation. Such networking environments are commonplace in office-wide or enterprise-wide computer networks, intranets, and the Internet.

When used in a LAN or WLAN networking environment, a computer system implementing aspects of the innovation is connected to the local network through a network interface or adapter. When used in a WAN or WLAN networking environment, the computer may include a modem, a wireless link, or other mechanisms for establishing communications over the wide-area network, such as the Internet. In a networked environment, program modules depicted relative to the computer, or portions thereof, may be stored in a remote data storage device. It will be appreciated that the network connections described or shown are exemplary and other mechanisms of establishing communications over wide area networks or the Internet may be used.

While various aspects have been described in the context of a preferred embodiment, additional aspects, features, and methodologies of the claimed innovations will be readily discernible from the description herein, by those of ordinary skill in the art. Many embodiments and adaptations of the disclosure and claimed innovations other than those herein described, as well as many variations, modifications, and equivalent arrangements and methodologies, will be apparent from or reasonably suggested by the disclosure and the foregoing description thereof, without departing from the substance or scope of the claims. Furthermore, any sequence (s) and/or temporal order of steps of various processes described and claimed herein are those considered to be the best mode contemplated for carrying out the claimed innovations. It should also be understood that, although steps of various processes may be shown and described as being in a preferred sequence or temporal order, the steps of any such processes are not limited to being carried out in any particular sequence or order, absent a specific indication of such to achieve a particular intended result. In most cases, the steps of such processes may be carried out in a variety of different sequences and orders, while still falling within the scope of the claimed innovations. In addition, some steps may be carried out simultaneously, contemporaneously, or in synchronization with other steps.

Clause 1. An electronics device, comprising: a clock circuit configured to generate a reference clock; a first oscillator configured to generate an initial waveform at an output based on the reference clock; a plurality of signal expansion circuits coupled in series and configured to receive the initial waveform at a front signal expansion circuit of the plurality of signal expansion circuits and output a resultant signal at an end signal expansion circuit of the plurality of signal expansion circuits, wherein each of the plurality of signal expansion circuits comprises a respective clock input configured to receive the reference clock, a respective frequency input, and a respective frequency output and each of the plurality of signal expansion circuits are configured to: receive an input frequency on the respective frequency input; generate a respective additional frequency based on the reference clock; generate a merged frequency by merging the input frequency and the respective additional frequency; and output the merged frequency from the respective frequency output; and an antenna configured to transmit a transmission signal based on the resultant signal.

Clause 2. The electronics device of clause 1 or any other clause herein, wherein the output of the first oscillator is coupled to a plurality of switches and the plurality of switches generate a plurality of paths from the output of the first oscillator to the respective frequency input of the front signal expansion circuit.

Clause 3. The electronics device of clause 2 or any other clause herein, wherein one of the plurality of paths comprises a direct electrical connection between the output of the first oscillator and the respective frequency input of the front signal expansion circuit.

Clause 4. The electronics device of clause 2 or any other clause herein, wherein one of the plurality of paths comprises a low-pass filter.

Clause 5. The electronics device of clause 2 or any other clause herein, wherein one of the plurality of paths is coupled to a local oscillator input of a mixer, a radio frequency input of the mixer is coupled to a noise generation circuit, and an intermediate frequency output of the mixer is coupled to the respective frequency input of the front signal expansion circuit.

Clause 6. The electronics device of clause 1 or any other clause herein, wherein the first oscillator comprises a fixed oscillator.

Clause 7. The electronics device of clause 1 or any other clause herein, wherein each of the plurality of signal expansion circuits comprises a respective attenuator coupled to the respective frequency input and configured to regulate an input amplitude.

Clause 8. The electronics device of clause 1 or any other clause herein, wherein each of the plurality of signal expansion circuits comprises a respective amplifier coupled to the respective frequency output and configured to amplify the merged frequency.

Clause 9. The electronics device of clause 1 or any other clause herein, wherein each of the plurality of signal expansion circuits comprises a mixer circuit configured to generate the merged frequency by merging the input frequency and the respective additional frequency.

Clause 10. The electronics device of clause 1 or any other clause herein, wherein the transmission signal comprises a plurality of different frequencies individually corresponding to a respective one of the plurality of signal expansion circuits.

Clause 11. A method, comprising: generating, via a first oscillator, an initial waveform based on a reference clock; receiving, via a first signal expansion circuit, the initial waveform; generating, via the first signal expansion circuit, a first merged frequency by mixing the initial waveform with a first additional frequency; receiving, via a second signal expansion circuit, the first merged frequency; generating, via the second signal expansion circuit, a resultant signal by mixing the first merged frequency with a second additional frequency; and transmitting, via an antenna, the resultant signal.

Clause 12. The method of clause 11 or any other clause herein, wherein generating the initial waveform further comprises applying at least one of: a low-pass filter, a high-pass filter, or a band-pass filter to the initial waveform.

Clause 13. The method of clause 11 or any other clause herein, wherein generating the initial waveform further comprises: generating a first mixed signal by mixing the initial waveform with a noise signal generated by a noise generation circuit; generating a second mixed signal by mixing the initial waveform with the noise signal generated by the noise generation circuit after applying at least one of: a low-pass filter, a high-pass filter, or a band-pass filter to the initial waveform; and outputting, via a switch, a selected signal by selecting between the first mixed signal and the second mixed signal.

Clause 14. The method of clause 11 or any other clause herein, wherein transmitting the resultant signal further comprises processing the resultant signal through an up/down converter prior to transmitting the resultant signal via the antenna.

Clause 15. The method of clause 11 or any other clause herein, further comprising: passing the initial waveform through a digital attenuator to reduce a power of the initial waveform; generating, via a second oscillator of the first signal expansion circuit, the first additional frequency, the first additional frequency equal the initial waveform; and mixing, via a mixer circuit of the first signal expansion circuit, the first additional frequency and the initial waveform to generate the first merged frequency, the first merged frequency double the initial waveform.

Clause 16. The method of clause 15 or any other clause herein, further comprising: measuring an initial temperature of the first signal expansion circuit; comparing the initial temperature of the first signal expansion circuit to temperature data, the temperature data comprising a relationship between a particular temperature of the first signal expansion circuit and an output power of the digital attenuator; selecting, based on the temperature data, the output power of the digital attenuator that corresponds with the initial temperature; and adjusting the digital attenuator to produce the output power corresponding with the initial temperature.

Clause 17. The method of clause 11 or any other clause herein, wherein generating the resultant signal further comprises generating the resultant signal at a frequency of at least one of: 433 MHz, 915 MHz, 1.2 GHz, 1.5 GHz, 2450 MHz, and 5800 MHz.

Clause 18. The method of clause 11 or any other clause herein, wherein the initial waveform is generated in a range of 2-4 GHz.

Clause 19. The method of clause 11 or any other clause herein, wherein the resultant signal is generated at a frequency in a range of 1.0-2.1 GHz.

Clause 20. The method of clause 11 or any other clause herein, further comprising amplifying the first merged frequency through an amplifier circuit.

The embodiments were chosen and described in order to explain the principles of the claimed innovations and their practical application so as to enable others skilled in the art to utilize the innovations and various embodiments and with various modifications as are suited to the particular use contemplated. Alternative embodiments will become apparent to those skilled in the art to which the claimed innovations pertain without departing from their spirit and scope. Accordingly, the scope of the claimed innovations is defined by the appended claims rather than the foregoing description and the exemplary embodiments described therein.

What is claimed:

1. An electronics device, comprising:
a clock circuit configured to generate a reference clock;
a first oscillator configured to generate an initial waveform at an output based on the reference clock;
a plurality of signal expansion circuits coupled in series and configured to receive the initial waveform at a front signal expansion circuit of the plurality of signal expansion circuits and output a resultant signal at an end signal expansion circuit of the plurality of signal expansion circuits, wherein each of the plurality of signal expansion circuits comprises a respective clock input configured to receive the reference clock, a respective frequency input, and a respective frequency output and each of the plurality of signal expansion circuits are configured to:
receive an input frequency on the respective frequency input;
generate a respective additional frequency based on the reference clock;
generate a merged frequency by merging the input frequency and the respective additional frequency; and output the merged frequency from the respective frequency output; and an antenna configured to transmit a transmission signal based on the resultant signal.

2. The electronics device of claim 1, wherein the output of the first oscillator is coupled to a plurality of switches and the plurality of switches generate a plurality of paths from the output of the first oscillator to the respective frequency input of the front signal expansion circuit.

3. The electronics device of claim 2, wherein one of the plurality of paths comprises a direct electrical connection between the output of the first oscillator and the respective frequency input of the front signal expansion circuit.

4. The electronics device of claim 2, wherein one of the plurality of paths comprises a low-pass filter.

5. The electronics device of claim 2, wherein one of the plurality of paths is coupled to a local oscillator input of a mixer, a radio frequency input of the mixer is coupled to a noise generation circuit, and an intermediate frequency output of the mixer is coupled to the respective frequency input of the front signal expansion circuit.

6. The electronics device of claim 1, wherein the first oscillator comprises a fixed oscillator.

7. The electronics device of claim 1, wherein each of the plurality of signal expansion circuits comprises a respective attenuator coupled to the respective frequency input and configured to regulate an input amplitude.

8. The electronics device of claim 1, wherein each of the plurality of signal expansion circuits comprises a respective amplifier coupled to the respective frequency output and configured to amplify the merged frequency.

9. The electronics device of claim 1, wherein each of the plurality of signal expansion circuits comprises a mixer circuit configured to generate the merged frequency by merging the input frequency and the respective additional frequency.

10. The electronics device of claim 1, wherein the transmission signal comprises a plurality of different frequencies individually corresponding to a respective one of the plurality of signal expansion circuits.

11. A method, comprising:
generating, via a first oscillator, an initial waveform based on a reference clock;
receiving, via a first signal expansion circuit, the initial waveform;
generating, via the first signal expansion circuit, a first merged frequency by mixing the initial waveform with a first additional frequency;
receiving, via a second signal expansion circuit, the first merged frequency;
generating, via the second signal expansion circuit, a resultant signal by mixing the first merged frequency with a second additional frequency; and
transmitting, via an antenna, the resultant signal.

12. The method of claim 11, wherein generating the initial waveform further comprises applying at least one of: a low-pass filter, a high-pass filter, or a band-pass filter to the initial waveform.

13. The method of claim 11, wherein generating the initial waveform further comprises:
generating a first mixed signal by mixing the initial waveform with a noise signal generated by a noise generation circuit;
generating a second mixed signal by mixing the initial waveform with the noise signal generated by the noise generation circuit after applying at least one of: a low-pass filter, a high-pass filter, or a band-pass filter to the initial waveform; and
outputting, via a switch, a selected signal by selecting between the first mixed signal and the second mixed signal.

14. The method of claim 11, wherein transmitting the resultant signal further comprises processing the resultant signal through an up/down converter prior to transmitting the resultant signal via the antenna.

15. The method of claim 11, further comprising:
passing the initial waveform through a digital attenuator to reduce a power of the initial waveform;
generating, via a second oscillator of the first signal expansion circuit, the first additional frequency, the first additional frequency equal the initial waveform; and
mixing, via a mixer circuit of the first signal expansion circuit, the first additional frequency and the initial waveform to generate the first merged frequency, the first merged frequency double the initial waveform.

16. The method of claim 15, further comprising:
measuring an initial temperature of the first signal expansion circuit;
comparing the initial temperature of the first signal expansion circuit to temperature data, the temperature data comprising a relationship between a particular temperature of the first signal expansion circuit and an output power of the digital attenuator;
selecting, based on the temperature data, the output power of the digital attenuator that corresponds with the initial temperature; and
adjusting the digital attenuator to produce the output power corresponding with the initial temperature.

17. The method of claim 11, wherein generating the resultant signal further comprises generating the resultant signal at a frequency of at least one of: 433 MHz, 915 MHz, 1.2 GHZ, 1.5 GHZ, 2450 MHz, and 5800 MHz.

18. The method of claim 11, wherein the initial waveform is generated in a range of 2-4 GHz.

19. The method of claim 11, wherein the resultant signal is generated at a frequency in a range of 1.0-2.1 GHz.

20. The method of claim 11, further comprising amplifying the first merged frequency through an amplifier circuit.

* * * * *